(12) United States Patent
Booth et al.

(10) Patent No.: US 9,153,421 B2
(45) Date of Patent: Oct. 6, 2015

(54) PASSIVE CAPACITIVELY-COUPLED ELECTROSTATIC (CCE) PROBE METHOD FOR DETECTING PLASMA INSTABILITIES IN A PLASMA PROCESSING CHAMBER

(75) Inventors: Jean-Paul Booth, Essonne (FR); Mikio Nagai, Fremont, CA (US); Douglas Keil, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 765 days.

(21) Appl. No.: 13/470,187

(22) Filed: May 11, 2012

(65) Prior Publication Data

US 2012/0316834 A1    Dec. 13, 2012

Related U.S. Application Data

(62) Division of application No. 12/498,950, filed on Jul. 7, 2009, now Pat. No. 8,179,152.

(60) Provisional application No. 61/078,747, filed on Jul. 7, 2008.

(51) Int. Cl.
*G01R 31/00* (2006.01)
*H01J 37/32* (2006.01)

(52) U.S. Cl.
CPC ............................... *H01J 37/32935* (2013.01)

(58) Field of Classification Search
CPC ............................... H05H 1/0081; H05H 1/24
USPC .................. 324/713, 457, 536, 654, 656, 705
See application file for complete search history.

(56) References Cited

U.S. PATENT DOCUMENTS

| | | |
|---|---|---|
| 4,595,487 A | 6/1986 | Nunlist |
| 4,963,713 A | 10/1990 | Horiuchi et al. |
| 4,982,067 A | 1/1991 | Marantz et al. |
| 5,009,738 A | 4/1991 | Gruenwald et al. |
| 5,175,472 A | 12/1992 | Johnson, Jr. et al. |
| 5,473,162 A | 12/1995 | Busch et al. |
| 5,703,488 A | 12/1997 | Ohmi et al. |
| 5,891,350 A | 4/1999 | Shan et al. |

(Continued)

FOREIGN PATENT DOCUMENTS

| | | |
|---|---|---|
| JP | 03-064897 | 3/1991 |
| JP | 07-037817 A | 2/1995 |

(Continued)

OTHER PUBLICATIONS

"International Preliminary Report on Patentability", Issued in PCT Application No. PCT/US2009/048747; Mailing Date: Jan. 13, 2011.

(Continued)

*Primary Examiner* — Vincent Q Nguyen

(57) ABSTRACT

A method for detecting plasma instability within a processing chamber of a plasma processing system during substrate processing is provided. The method includes collecting a set of process data, the process data including a set of induced current signals flowing through a measuring capacitor. The method further includes converting the set of induced current signals into a set of analog voltage signals and converting the set of analog voltage signals into a set of digital signals. The method also includes analyzing the set of digital signals to detect high frequency perturbations, the high frequency perturbations indicating the plasma instability.

20 Claims, 16 Drawing Sheets

(56) References Cited

U.S. PATENT DOCUMENTS

| | | |
|---|---|---|
| 5,936,413 A | 8/1999 | Booth et al. |
| 5,985,092 A | 11/1999 | Chiu et al. |
| 5,989,349 A | 11/1999 | Ke et al. |
| 6,024,831 A | 2/2000 | Hwang et al. |
| 6,140,215 A | 10/2000 | Foster et al. |
| 6,165,311 A | 12/2000 | Collins et al. |
| 6,176,930 B1 | 1/2001 | Koai et al. |
| 6,218,312 B1 | 4/2001 | Collins et al. |
| 6,220,202 B1 | 4/2001 | Foster et al. |
| 6,291,072 B1 | 9/2001 | Kimoto et al. |
| 6,326,794 B1 | 12/2001 | Lundquist et al. |
| 6,344,084 B1 | 2/2002 | Koinuma et al. |
| 6,347,749 B1 | 2/2002 | Moore et al. |
| 6,440,260 B1 | 8/2002 | Denda et al. |
| 6,447,691 B1 | 9/2002 | Denda et al. |
| 6,513,452 B2 | 2/2003 | Shan et al. |
| 6,626,998 B1 | 9/2003 | Dunham |
| 6,833,710 B2 | 12/2004 | Benveniste |
| 6,894,474 B2 | 5/2005 | Cox et al. |
| 6,902,646 B2 | 6/2005 | Mahoney et al. |
| 6,972,071 B1 | 12/2005 | Tyler |
| 7,013,834 B2 | 3/2006 | Tyler et al. |
| 7,067,432 B2 | 6/2006 | Xu et al. |
| 7,093,560 B2 | 8/2006 | Tong et al. |
| 7,334,477 B1 | 2/2008 | Pirkle |
| 7,374,636 B2 | 5/2008 | Horioka et al. |
| 7,413,672 B1 | 8/2008 | Keil et al. |
| 7,479,207 B2 | 1/2009 | Kimball et al. |
| 7,514,934 B2 * | 4/2009 | Shuto et al. ............... 324/536 |
| 7,557,591 B2 | 7/2009 | Donohue |
| 7,651,568 B2 | 1/2010 | Ishizaka et al. |
| 7,691,243 B2 | 4/2010 | Vukovic |
| 7,723,994 B2 | 5/2010 | Kimball et al. |
| 7,867,355 B2 | 1/2011 | Kimball et al. |
| 7,928,366 B2 | 4/2011 | Bogart et al. |
| 7,994,794 B2 | 8/2011 | Kimball et al. |
| 8,070,880 B2 | 12/2011 | Marubayashi et al. |
| 8,159,233 B2 | 4/2012 | Booth et al. |
| 8,179,152 B2 | 5/2012 | Booth et al. |
| 8,333,166 B2 | 12/2012 | Bolden, II et al. |
| 8,382,939 B2 | 2/2013 | Kutney et al. |
| 8,547,085 B2 | 10/2013 | Booth et al. |
| 8,780,522 B2 | 7/2014 | Booth et al. |
| 8,849,585 B2 | 9/2014 | Keil et al. |
| 2001/0006095 A1 | 7/2001 | Snijders et al. |
| 2001/0025691 A1 | 10/2001 | Kanno et al. |
| 2002/0011213 A1 | 1/2002 | Ramiah et al. |
| 2002/0024338 A1 | 2/2002 | Saho et al. |
| 2002/0100555 A1 | 8/2002 | Hao et al. |
| 2002/0139478 A1 | 10/2002 | Ma et al. |
| 2003/0038114 A1 | 2/2003 | Howald |
| 2003/0150560 A1 | 8/2003 | Kinnard et al. |
| 2003/0168168 A1 | 9/2003 | Liu et al. |
| 2003/0196755 A1 | 10/2003 | Antolik |
| 2003/0196760 A1 | 10/2003 | Tyler et al. |
| 2003/0205328 A1 | 11/2003 | Kinnard et al. |
| 2003/0210510 A1 | 11/2003 | Hann et al. |
| 2003/0221780 A1 | 12/2003 | Lei et al. |
| 2004/0001006 A1 | 1/2004 | MacPherson et al. |
| 2004/0004708 A1 | 1/2004 | Willis |
| 2004/0028810 A1 | 2/2004 | Grant et al. |
| 2004/0035364 A1 | 2/2004 | Tomoyoshi et al. |
| 2004/0050492 A1 | 3/2004 | Tsuei et al. |
| 2004/0107906 A1 | 6/2004 | Collins et al. |
| 2004/0126492 A1 | 7/2004 | Weaver et al. |
| 2004/0187780 A1 | 9/2004 | Park et al. |
| 2005/0032253 A1 | 2/2005 | Hsu et al. |
| 2005/0103439 A1 | 5/2005 | Goodman |
| 2005/0194094 A1 * | 9/2005 | Yasaka ............... 156/345.28 |
| 2005/0211384 A1 | 9/2005 | Hayashi |
| 2005/0212450 A1 | 9/2005 | Martinez et al. |
| 2005/0229849 A1 | 10/2005 | Silvetti et al. |
| 2006/0021970 A1 | 2/2006 | Parsons |
| 2006/0150913 A1 | 7/2006 | Wang et al. |
| 2006/0213437 A1 | 9/2006 | Ishizaka et al. |
| 2006/0213438 A1 | 9/2006 | Ishizaka et al. |
| 2006/0216406 A1 | 9/2006 | Hudson et al. |
| 2006/0249729 A1 | 11/2006 | Mundt et al. |
| 2006/0288934 A1 | 12/2006 | Takahashi et al. |
| 2007/0080138 A1 | 4/2007 | Hoffman et al. |
| 2007/0113783 A1 | 5/2007 | Lee et al. |
| 2007/0131168 A1 | 6/2007 | Gomi et al. |
| 2007/0158026 A1 | 7/2007 | Amikura |
| 2007/0162172 A1 | 7/2007 | Tanaka et al. |
| 2007/0215285 A1 | 9/2007 | Kimball et al. |
| 2008/0066861 A1 | 3/2008 | Kimball et al. |
| 2009/0007642 A1 | 1/2009 | Busby et al. |
| 2009/0133836 A1 | 5/2009 | Kimball et al. |
| 2009/0277584 A1 | 11/2009 | Hudson et al. |
| 2009/0322342 A1 | 12/2009 | Keil |
| 2010/0006417 A1 | 1/2010 | Booth et al. |
| 2010/0007337 A1 | 1/2010 | Booth et al. |
| 2010/0007359 A1 | 1/2010 | Booth et al. |
| 2010/0007362 A1 | 1/2010 | Booth et al. |
| 2010/0008015 A1 | 1/2010 | Booth et al. |
| 2010/0033195 A1 | 2/2010 | Booth et al. |
| 2010/0229372 A1 | 9/2010 | Kimball et al. |
| 2011/0024045 A1 | 2/2011 | Keil et al. |
| 2011/0128017 A1 | 6/2011 | Booth et al. |
| 2011/0224046 A1 | 9/2011 | Chen |
| 2012/0247678 A1 | 10/2012 | Takahashi et al. |
| 2012/0316834 A1 | 12/2012 | Booth et al. |

FOREIGN PATENT DOCUMENTS

| | | |
|---|---|---|
| JP | 2000-268993 | 9/2000 |
| JP | 2001-144071 A | 5/2001 |
| JP | 2002063999 A | 2/2002 |
| JP | 2003-318115 | 11/2003 |
| JP | 2007037817 A | 2/2007 |
| JP | 2008-016517 A | 1/2008 |
| KR | 10-0378187 B1 | 3/2003 |
| KR | 10-2004-0024720 A | 3/2004 |
| KR | 10-2008-0048310 A | 6/2006 |
| KR | 10-2007-0035346 A | 3/2007 |
| WO | WO97/11587 | 3/1997 |
| WO | WO2007/145801 A2 | 12/2007 |
| WO | WO2008/002938 | 1/2008 |

OTHER PUBLICATIONS

"International Preliminary Report on Patentability", Issued in PCT Application No. PCT/US2009/049756; Mailing Date: Jan. 20, 2011.
"International Preliminary Report on Patentability", Issued in PCT Application No. PCT/US2009/049762; Mailing Date: Jan. 20, 2011.
"International Preliminary Report on Patentability", Issued in PCT Application No. PCT/US2009/049757; Mailing Date: Jan. 20, 2011.
"International Preliminary Report on Patentability", Issued in PCT Application No. PCT/US2009/049759; Mailing Date: Jan. 20, 2011.
"International Preliminary Report on Patentability", Issued in PCT Application No. PCT/US2009/049760; Mailing Date: Jan. 20, 2011.
"International Preliminary Report on Patentability", Issued in PCT Application No. PCT/US2009/049761; Mailing Date: Jan. 20, 2011.
"International Search Report", Issued in PCT Application No. PCT/US2009/049757; Mailing Date: Feb. 23, 2010.
"International Search Report", Issued in PCT Application No. PCT/US2009/049760; Mailing Date: Feb. 23, 2010.
"International Search Report", Issued in PCT Application No. PCT/US2009/049759; Mailing Date: Feb. 3, 2010.
"International Search Report", Issued in PCT Application No. PCT/US2009/049762; Mailing Date: Feb. 24, 2010.
"International Search Report", Issued in PCT Application No. PCT/US2009/049756; Mailing Date: Mar. 2, 2010.
"International Search Report", Issued in PCT Application No. PCT/US2009/049761; Mailing Date: Feb. 24, 2010.
"International Search Report", Issued in PCT Application No. PCT/US2009/048747; Mailing Date: Feb. 11, 2010.
"Non Final Office Action", U.S. Appl. No. 12/477,007, Mailing Date: Aug. 23, 2011.
"Non Final Office Action", U.S. Appl. No. 12/498,939, Mailing Date: Oct. 20, 2011.

(56) References Cited

OTHER PUBLICATIONS

"Non Final Office Action", U.S. Appl. No. 12/498,940, Mailing Date: Dec. 7, 2011.
"Notice of Allowance", U.S. Appl. No. 12/498,934, Mailing Date: Nov. 28, 2011.
"Written Opinion", Issued in PCT Application No. PCT/US2009/048747; Mailing Date: Feb. 11, 2010.
"Written Opinion", Issued in PCT Application No. PCT/US2009/049757; Mailing Date: Feb. 23, 2010.
"Written Opinion", Issued in PCT Application No. PCT/US2009/049759; Mailing Date: Feb. 3, 2010.
"Written Opinion", Issued in PCT Application No. PCT/US2009/049756; Mailing Date: Mar. 2, 2010.
"Written Opinion", Issued in PCT Application No. PCT/US2009/049760; Mailing Date: Feb. 23, 2010.
"Written Opinion", Issued in PCT Application No. PCT/US2009/049762; Mailing Date: Feb. 24, 2010.
"Written Opinion", Issued in PCT Application No. PCT/US2009/049761; Mailing Date: Feb. 24, 2010.
Japan Office Action dated Jan. 14, 2014; for Japanese Application No. 2011-517509; International Filing Date: Jul. 7, 2009; 13 Pages.
Abstract of B M Annaratone et al.; Measurement Science and Technology; vol. 2, pp. 795-800; "A comparison of a passive (filtered) and an active (driven) probe for RF plasma diagnostics"; 1991.
Singapore Office Action dated Jul. 25, 2014 for application No. 2013060611; 20 pages.

* cited by examiner

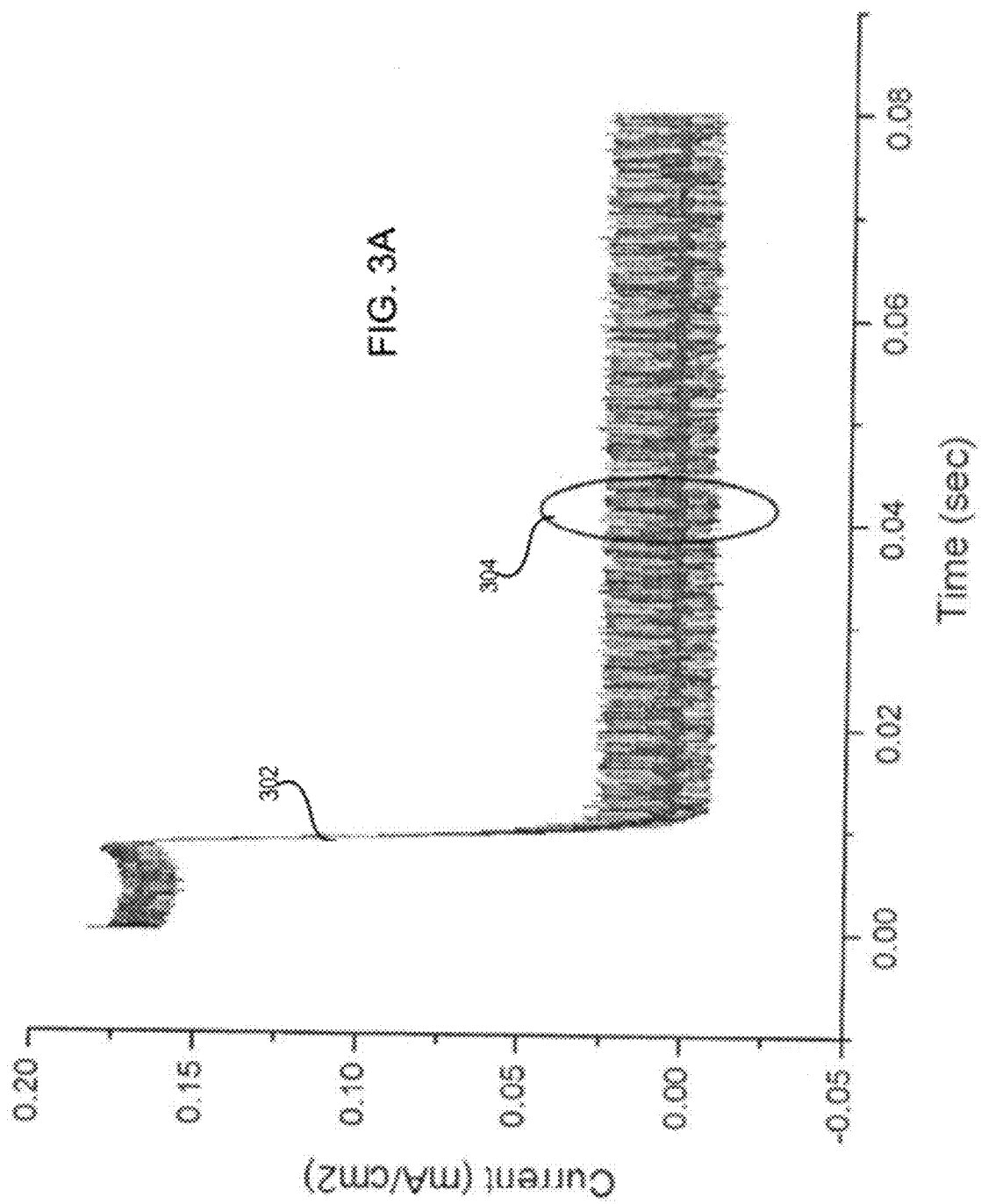

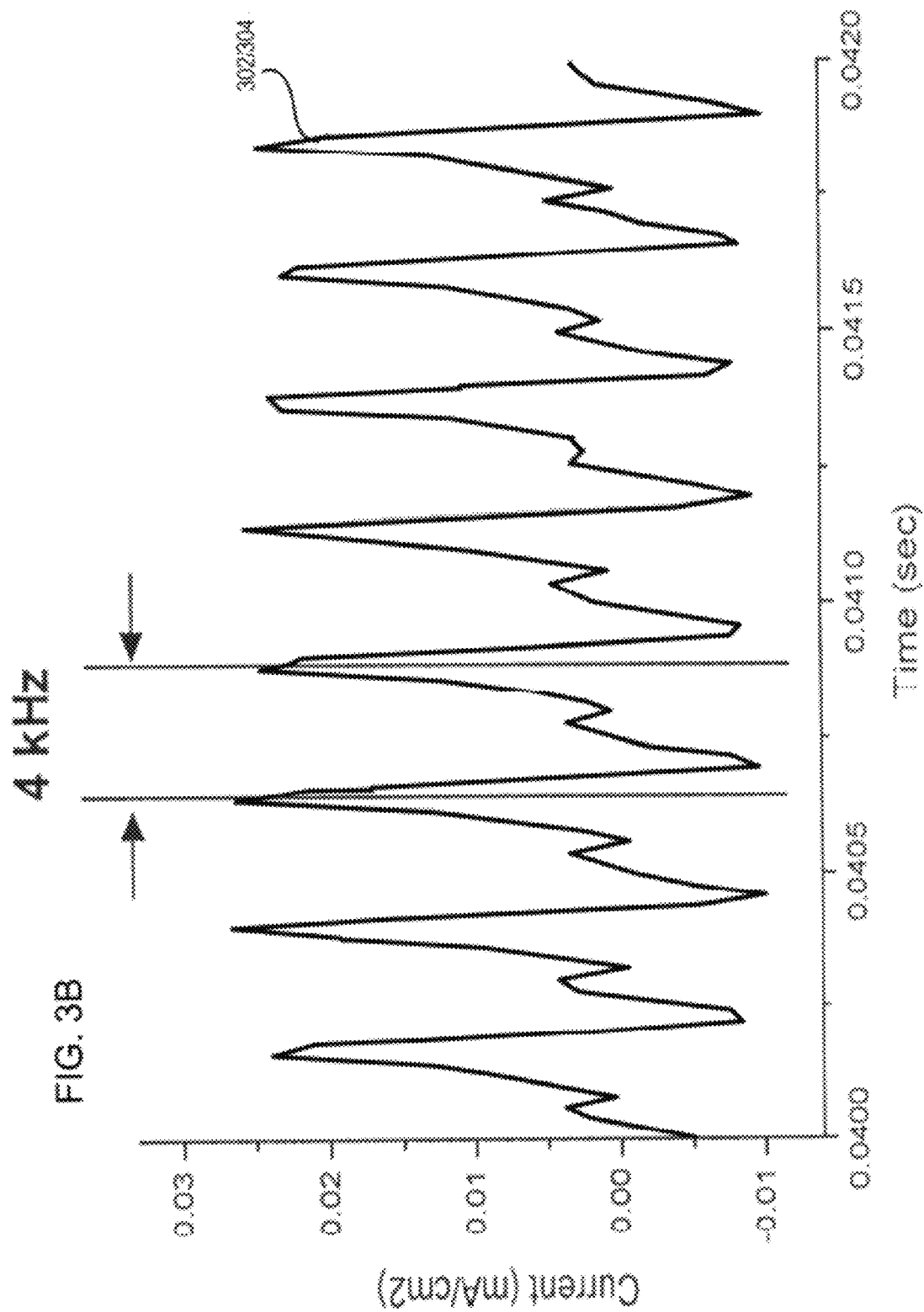

PASSIVE CAPACITIVELY-COUPLED ELECTROSTATIC (CCE) PROBE METHOD FOR DETECTING PLASMA INSTABILITIES IN A PLASMA PROCESSING CHAMBER

PRIORITY CLAIM

This divisional application claims priority under 37 CFR 1.53(b) of and claims the benefit under 35 U.S.C. §120 to a commonly assigned patent application entitled "PASSIVE CAPACITIVELY-COUPLED ELECTROSTATIC (CCE) PROBE ARRANGEMENT FOR DETECTING PLASMA INSTABILITIES IN A PLASMA PROCESSING CHAMBER", application Ser. No. 12/498,950 filed on Jul. 7, 2009 now U.S. Pat. No. 8,179,152, which claims priority under 35 U.S.C. §119(e) to a commonly assigned provisional patent application entitled "Passive Capacitively-Coupled Electrostatic (CCE) Probe Arrangement For Detecting Plasma Instabilities in a Plasma Processing Chamber," by Booth et al., Application Ser. No. 61/078,747, filed on Jul. 7, 2008, which is incorporated by reference herein.

BACKGROUND OF THE INVENTION

During the processing of a substrate in the plasma processing chamber, satisfactory results often require tight control of the process parameters. This is particularly true for processes such as deposition, etching, cleaning, etc., that, are employed to manufacture modern high density integrated circuits. When the processing parameters (such as bias voltage, RF power, ion flux, plasma density, pressure, etc.) exceed a narrow, pre-defined window, a process excursion is said to have occurred. These process excursions represent undesirable events that often lead to undesirable processing results (e.g., poor etch profile, low selectivity, etc.). Accordingly, the detection, characterization, and avoidance of process excursions are important tasks for process engineers in the manufacture of integrated circuits.

Detecting, process excursions is often performed via monitoring of various process parameters. Some process parameters (such as bias voltage, reflected power, etc.) may be measured directly while others may be inferred from measured parameters.

Plasma instability faults often caused by, for example, transitions and ground delivery faults, represent a type of process excursion that has the potential to decrease yield, damage the substrate and/or damage the chamber components. Furthermore, unconfined plasma occurrences, which tend to negatively impact yield and tend to shorten the expected lifetime of chamber components, are often preceded by plasma instabilities.

Accordingly, the detection of plasma instabilities is important for the purpose of diagnostic and recipe adjustment in order to improve process results and process yield, as well as to avoid damage to the substrate and/or the chamber components.

BRIEF SUMMARY OF THE INVENTION

The invention relates, in an embodiment, to an arrangement for detecting plasma instability within a processing chamber of a plasma processing system during substrate processing. The arrangement includes a probe arrangement, wherein the probe arrangement is disposed on a surface of the processing chamber and is configured to measure at least one plasma processing parameter. The probe arrangement includes a plasma-facing sensor and a measuring capacitor, wherein the plasma-facing sensor is coupled to a first plate of the measuring capacitor. The arrangement also includes a detection arrangement, which is coupled to a second plate of the measuring capacitor. The defection arrangement is configured to convert an induced current flowing through the measuring capacitor into a set of digital signals, the set of digital signals being processed to detect the plasma instability.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in die figures of the accompanying drawings and in which like reference numerals refer to similar elements and in which.

Figure 2:
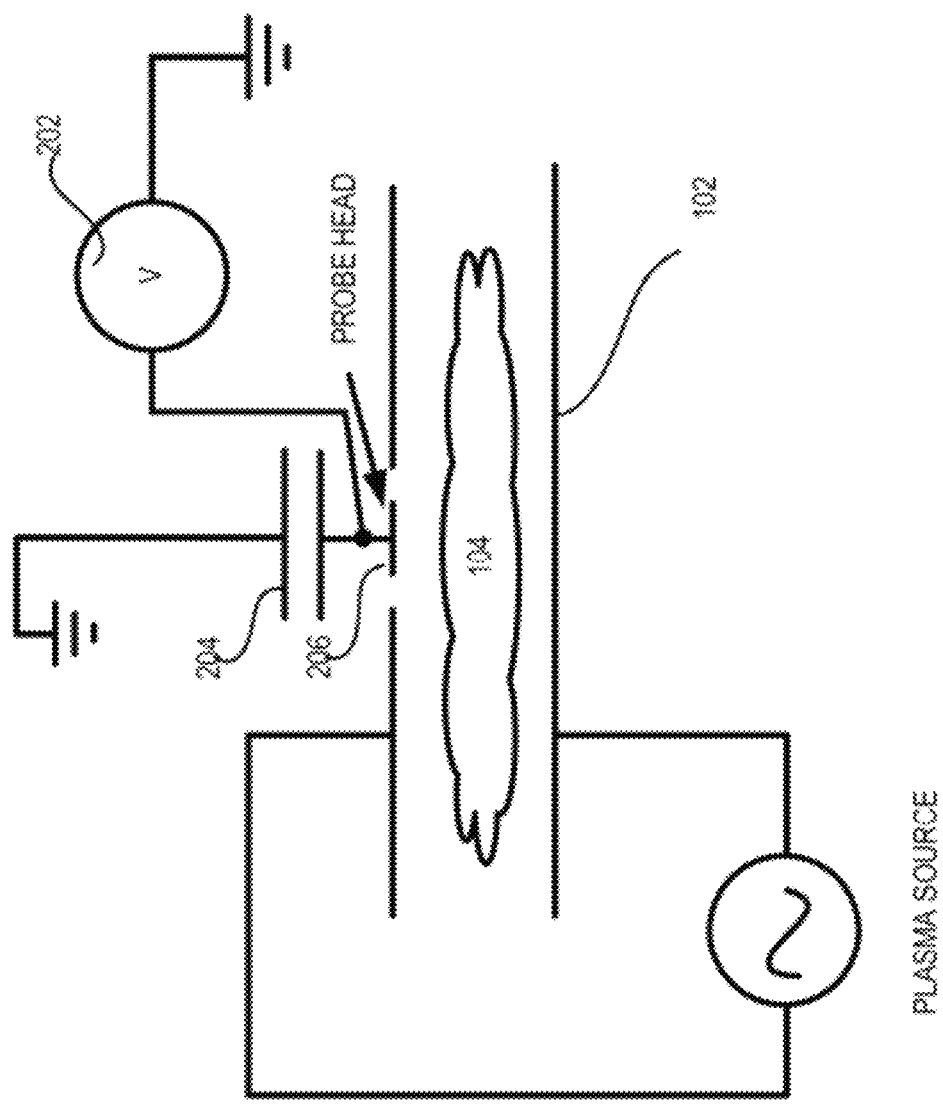

Alternatively or additionally, as shown in FIG. 2, a voltage measurement device may be coupled to the plate of the measuring capacitor that is also coupled to the probe head.

FIGS. 3A and 3B show, in accordance with an embodiment of the invention, a plot of the oscillation patterns indicative of some plasma instability events.

Figure 4A:
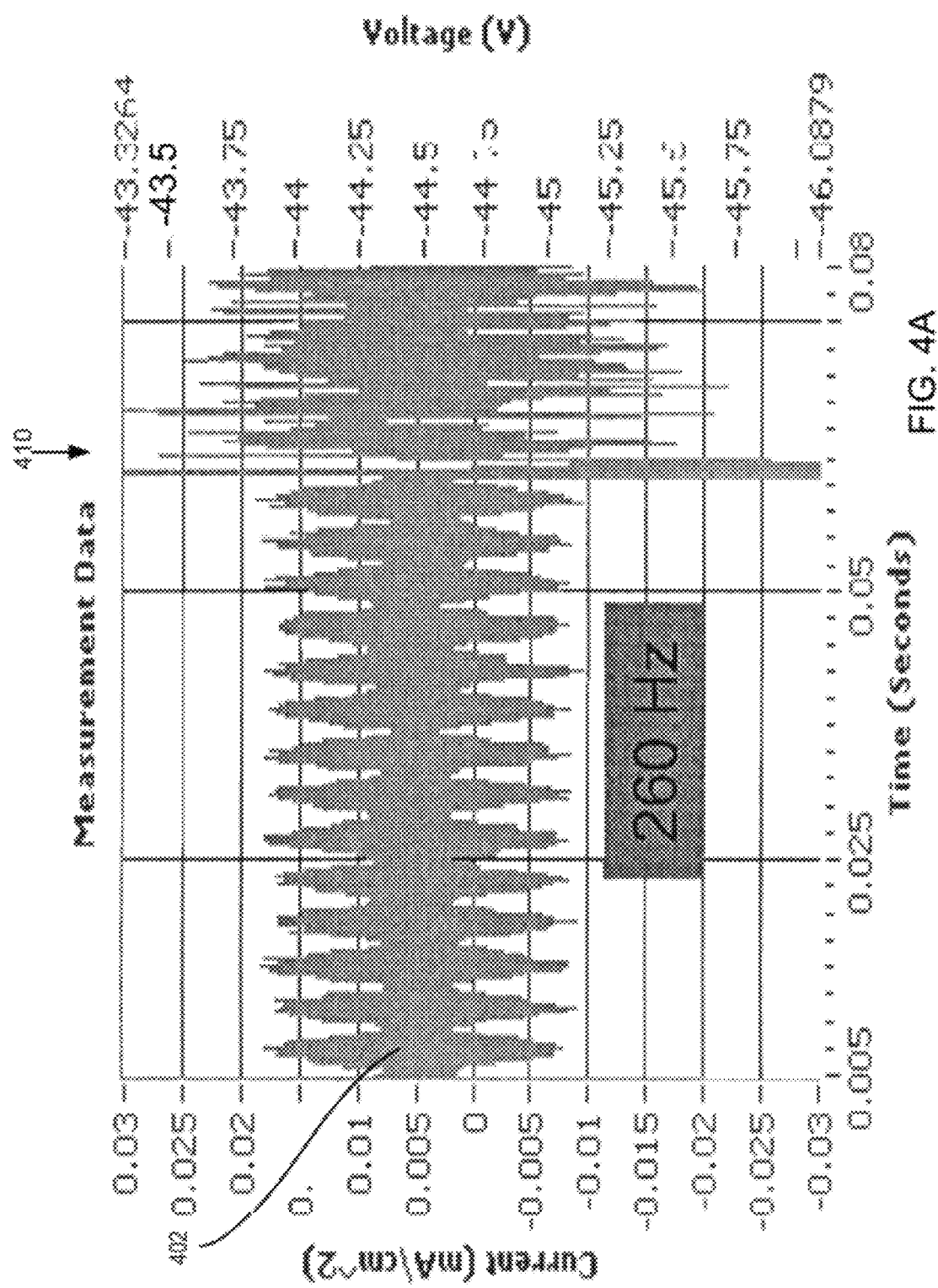
Figure 4B:
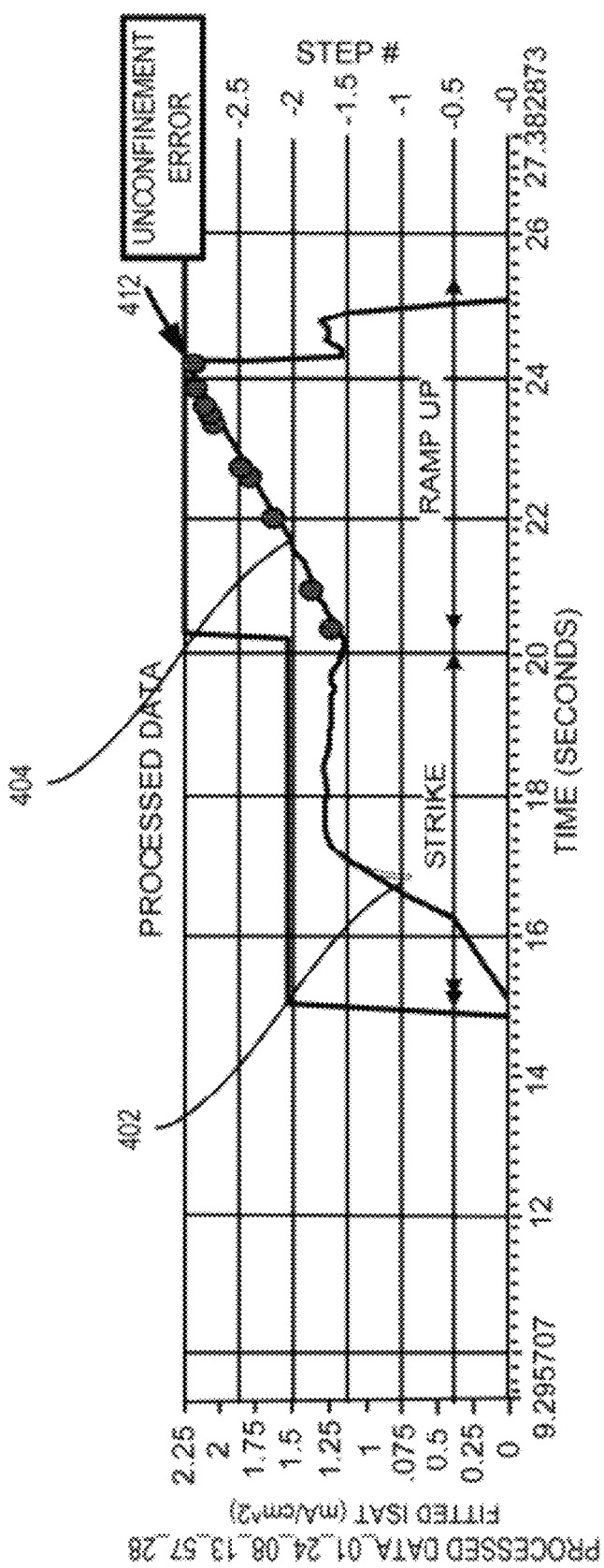

FIGS. 4A and 4B show, in accordance with an embodiment of the invention, a plot of the oscillation patterns indicative of plasma instability before and leading up to a plasma unconfinement event.

Figure 5:
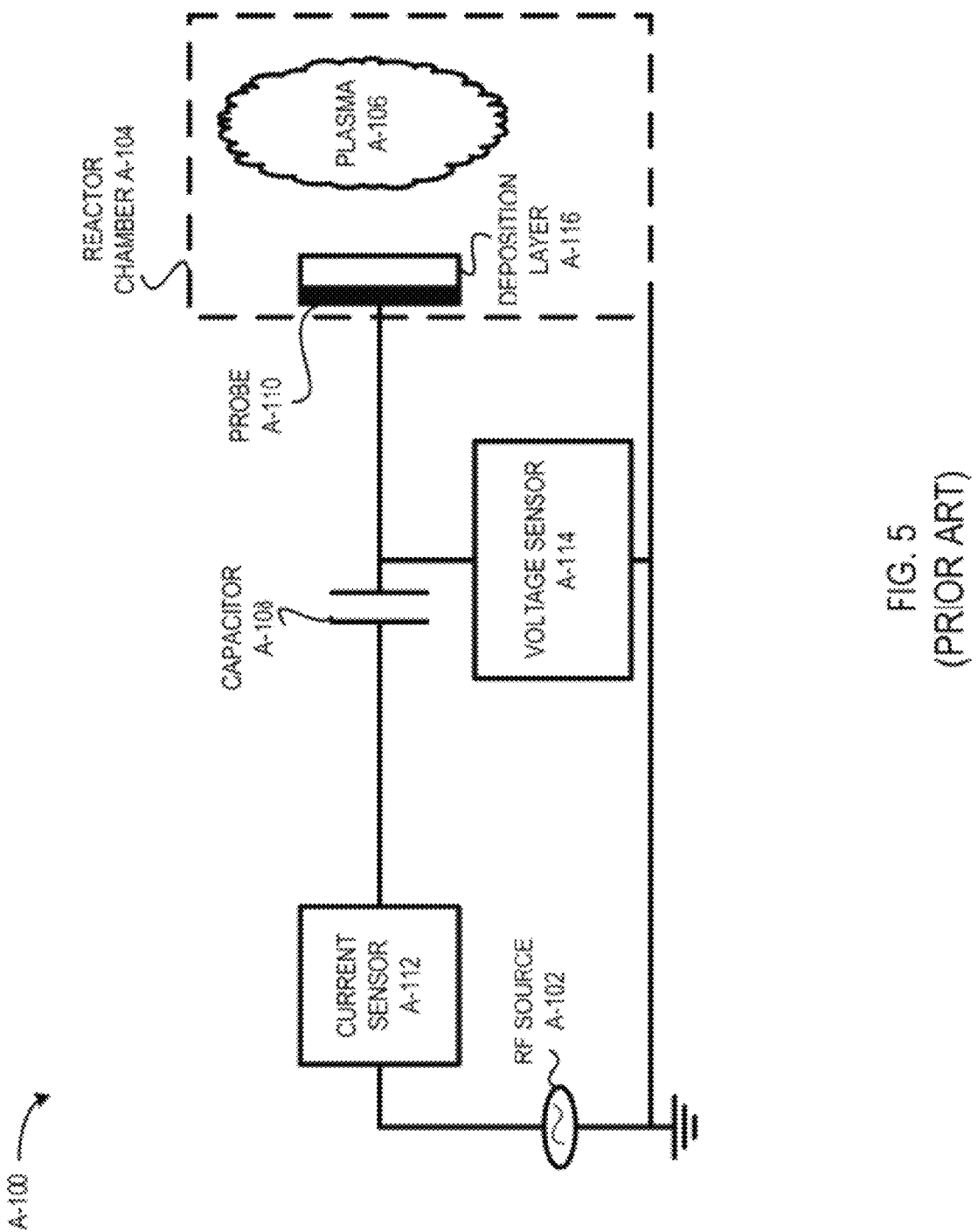

FIG. 5 of the DISCUSSION shows a simple schematic diagram of a portion of a plasma system with a radio frequency (RF) source capacitively-coupled to a reactor chamber to produce plasma.

Figure 6:
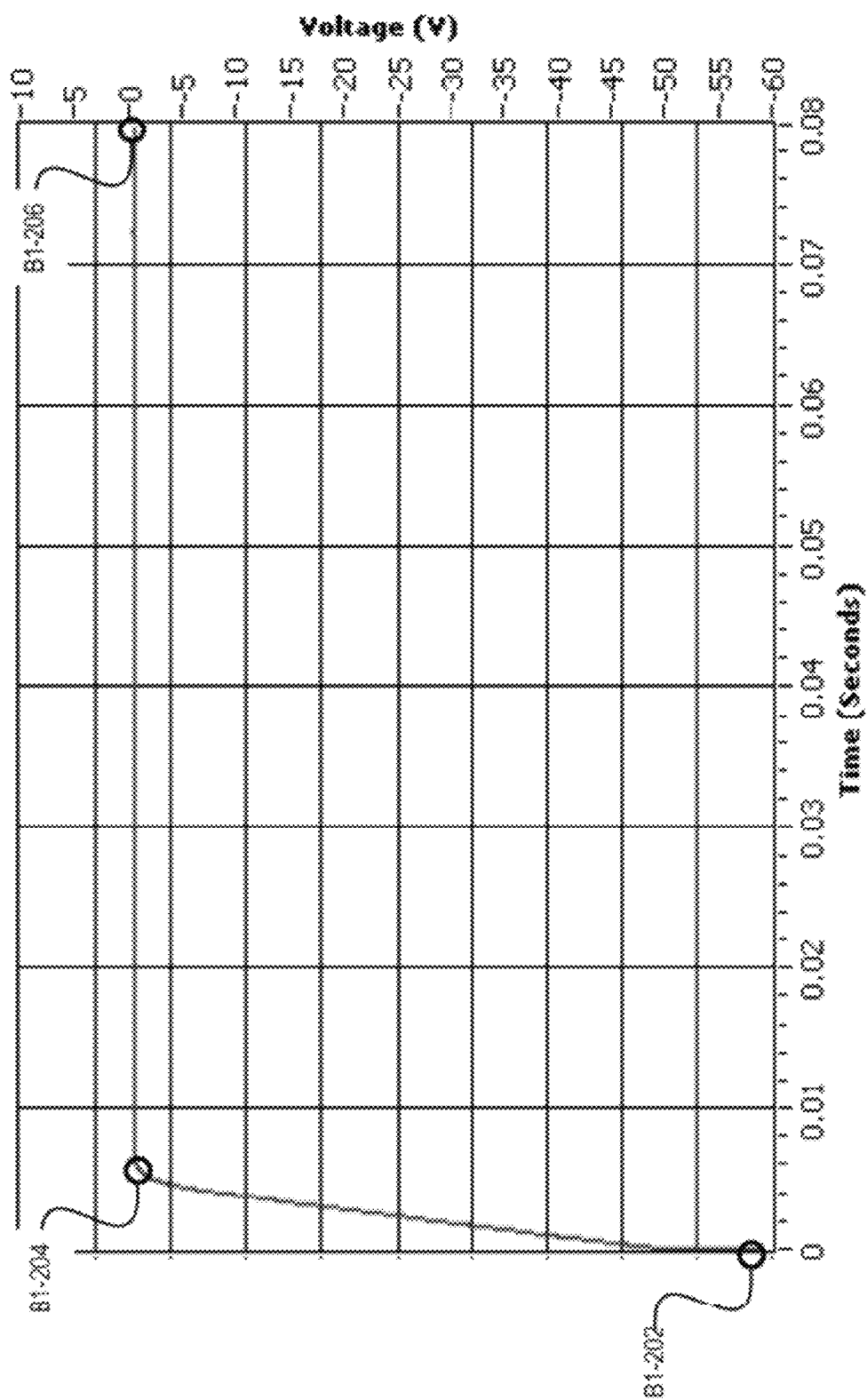

FIG. 6 of the DISCUSSION shows a graph of voltage versus time after a RF charge.

Figure 7:
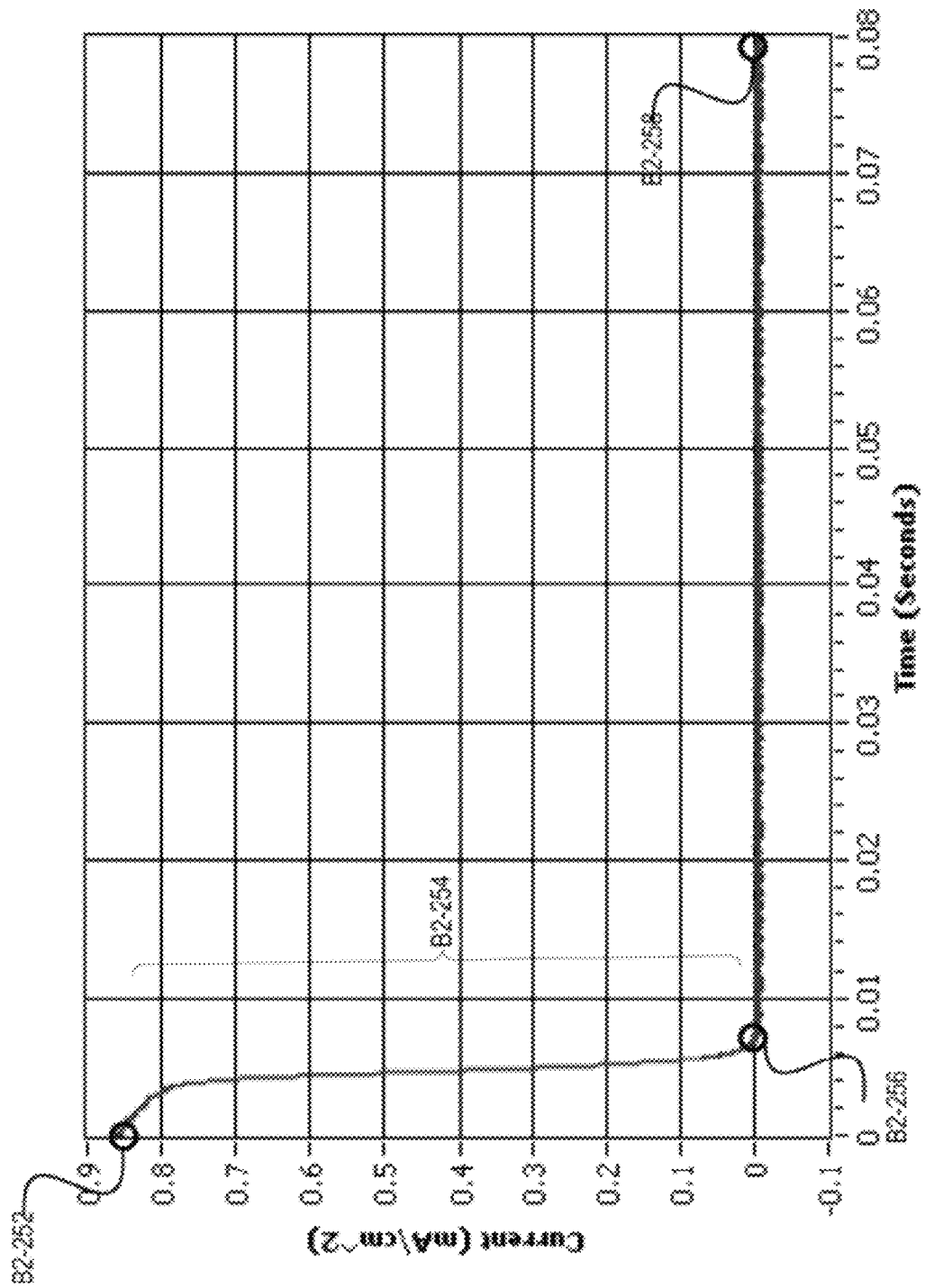

FIG. 7 of the DISCUSSION shows a graph of current data collected after a RF charge.

Figure 8:
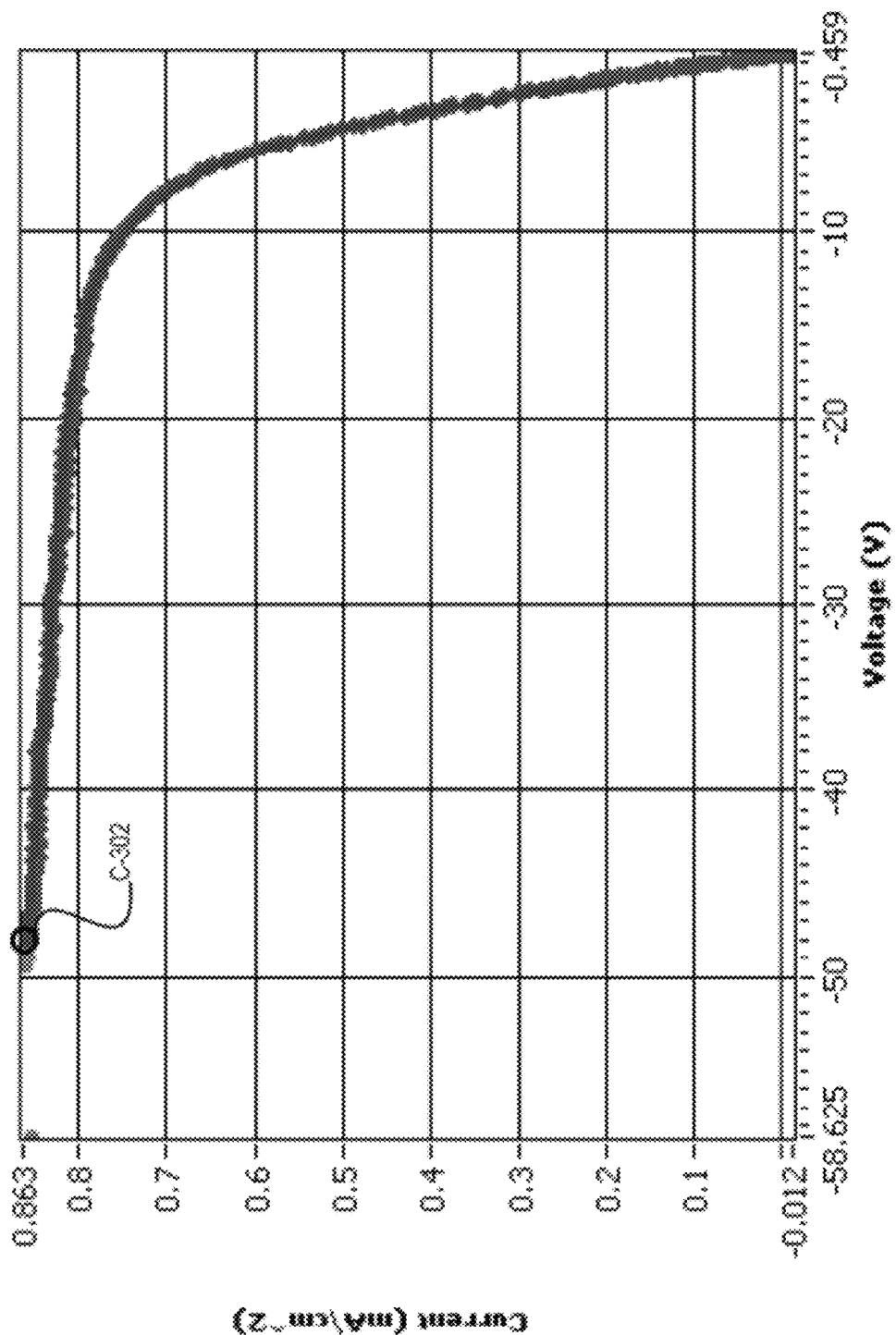

FIG. 8 of the DISCUSSION shows a simple current versus voltage graph for a single time interval between a RF burst.

Figure 9:
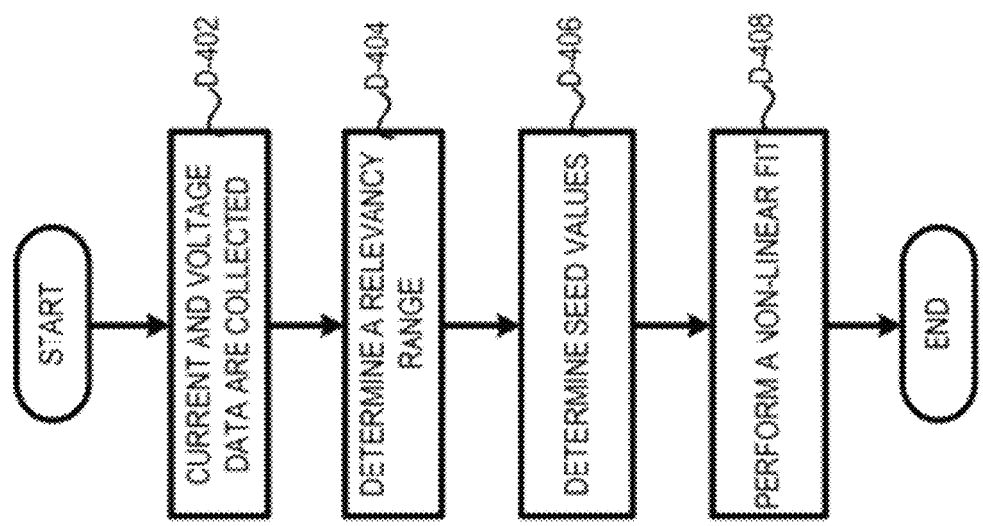

FIG. 9 of the DISCUSSION shows, in an embodiment of the invention, a simple flow chart illustrating the overall steps for automatically characterizing plasma during substrate processing.

Figure 10:
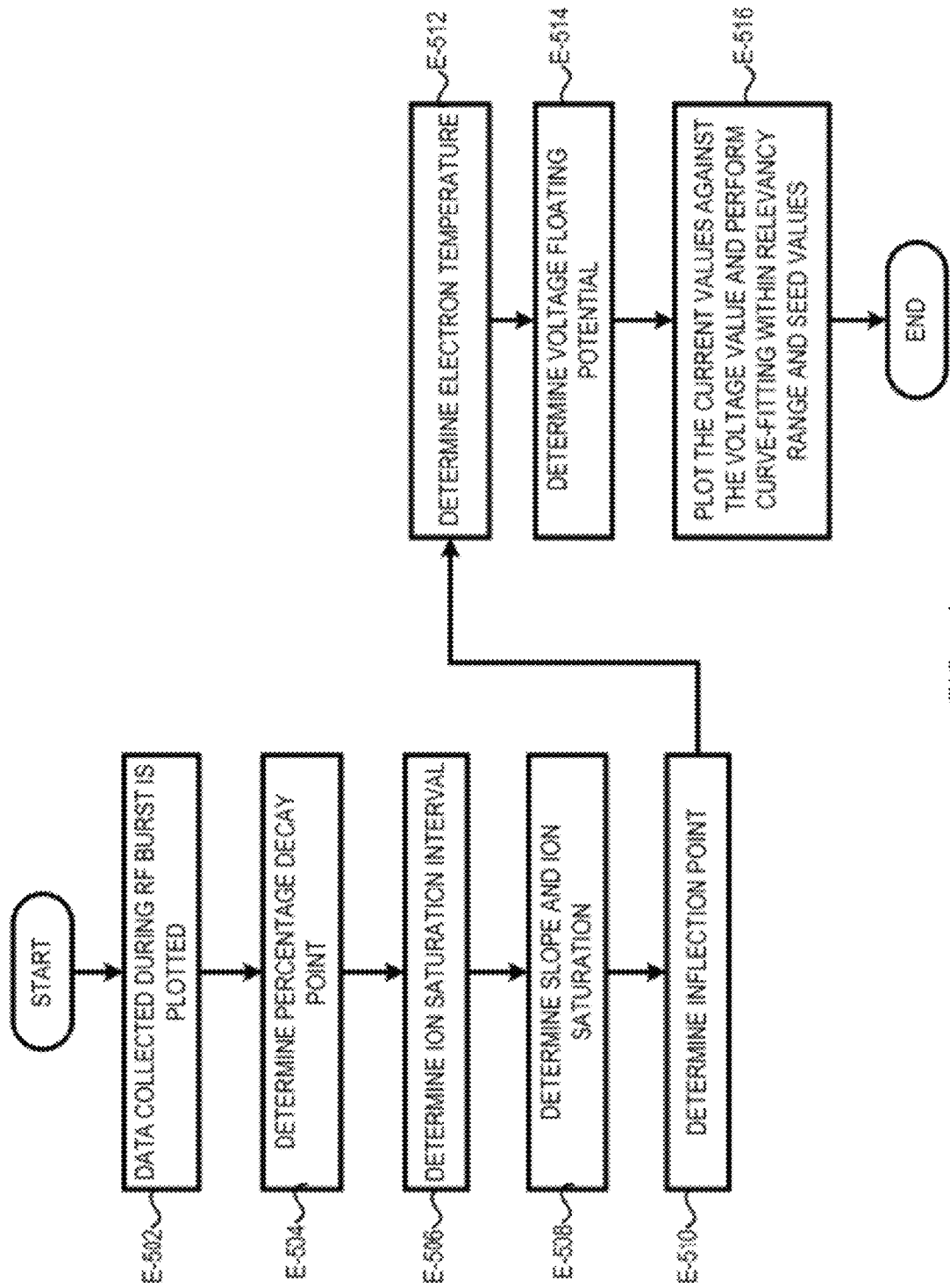

FIG. 10 of the DISCUSSION shows, in an embodiment of the invention, a simple algorithm for determining the relevancy range and the seed values.

Figure 11:
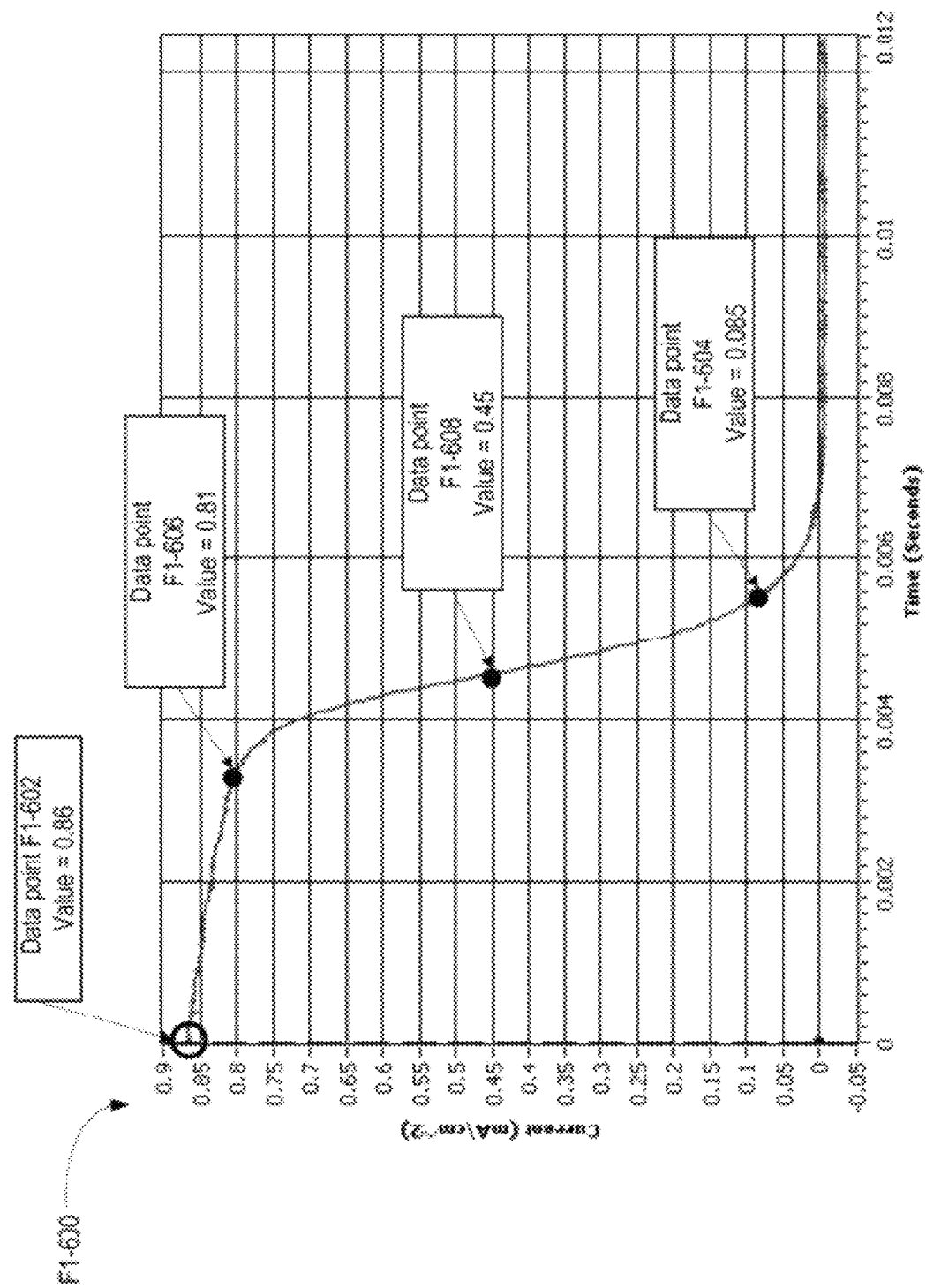

FIG. 11 of the DISCUSSION shows an example of current versus time after a RF burst.

Figure 12:
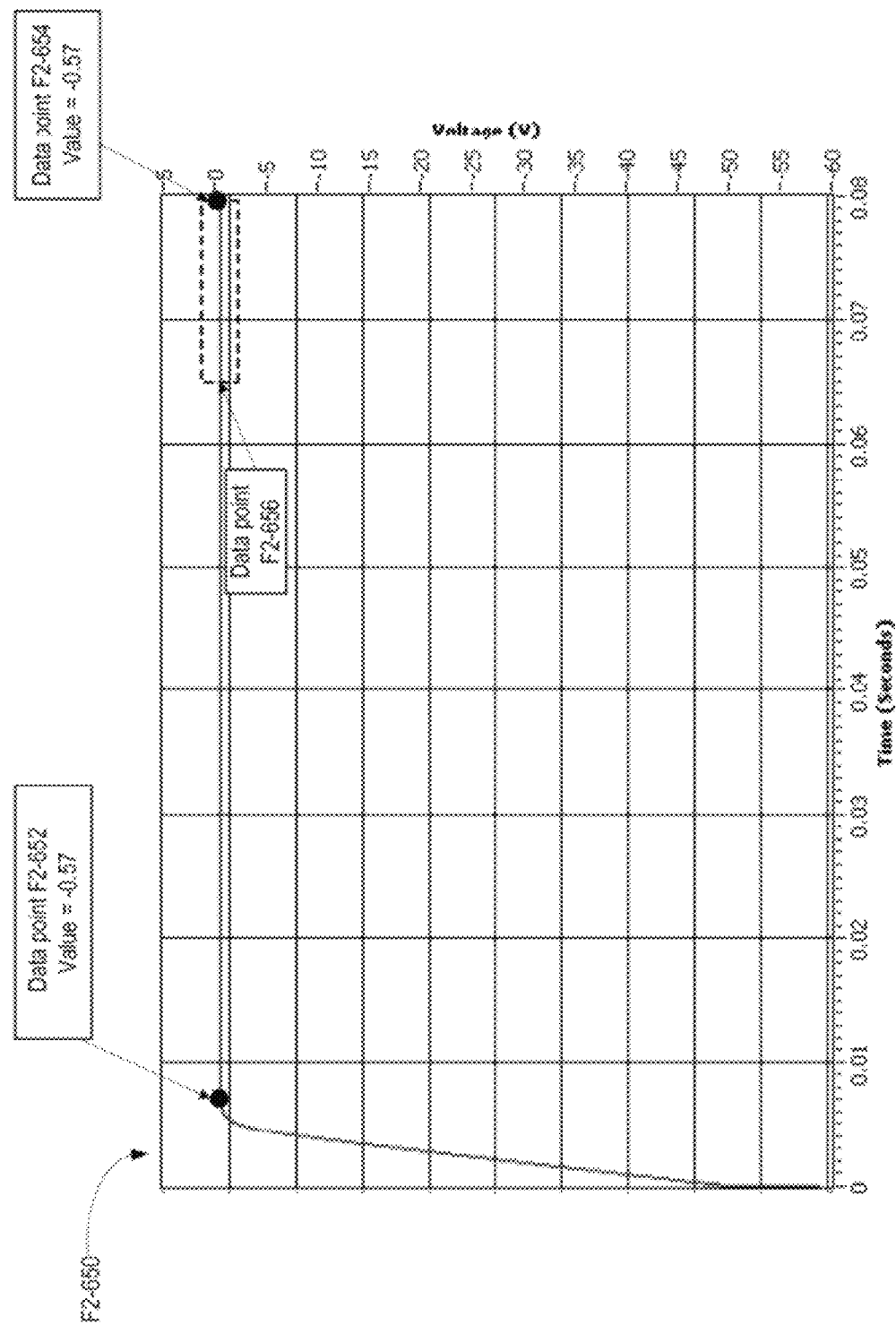

FIG. 12 of the DISCUSSION shows an example of voltage versus time after a RF burst.

Figure 13:
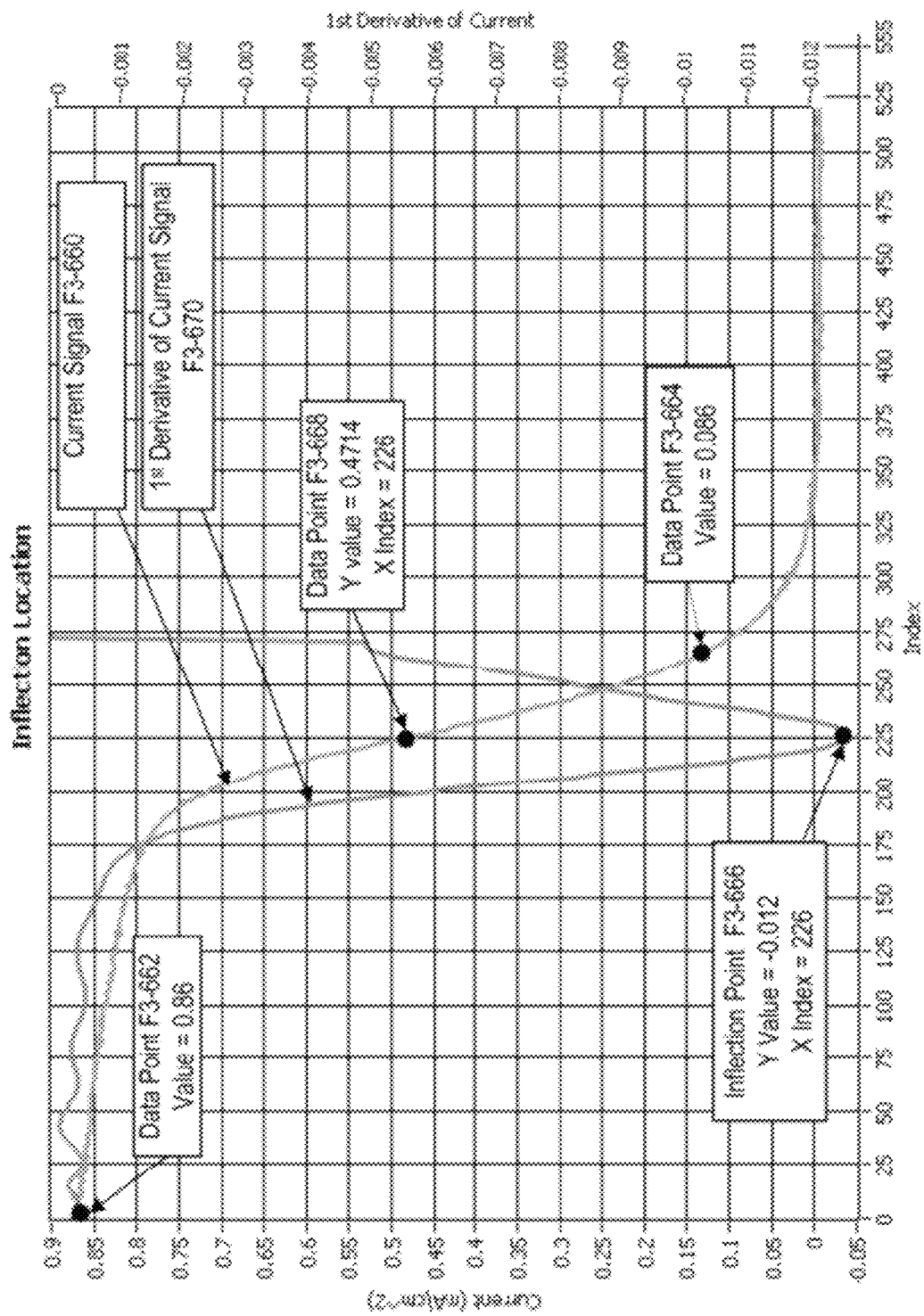

FIG. 13 of the DISCUSSION shows an example of art inflection point.

Figure 14:
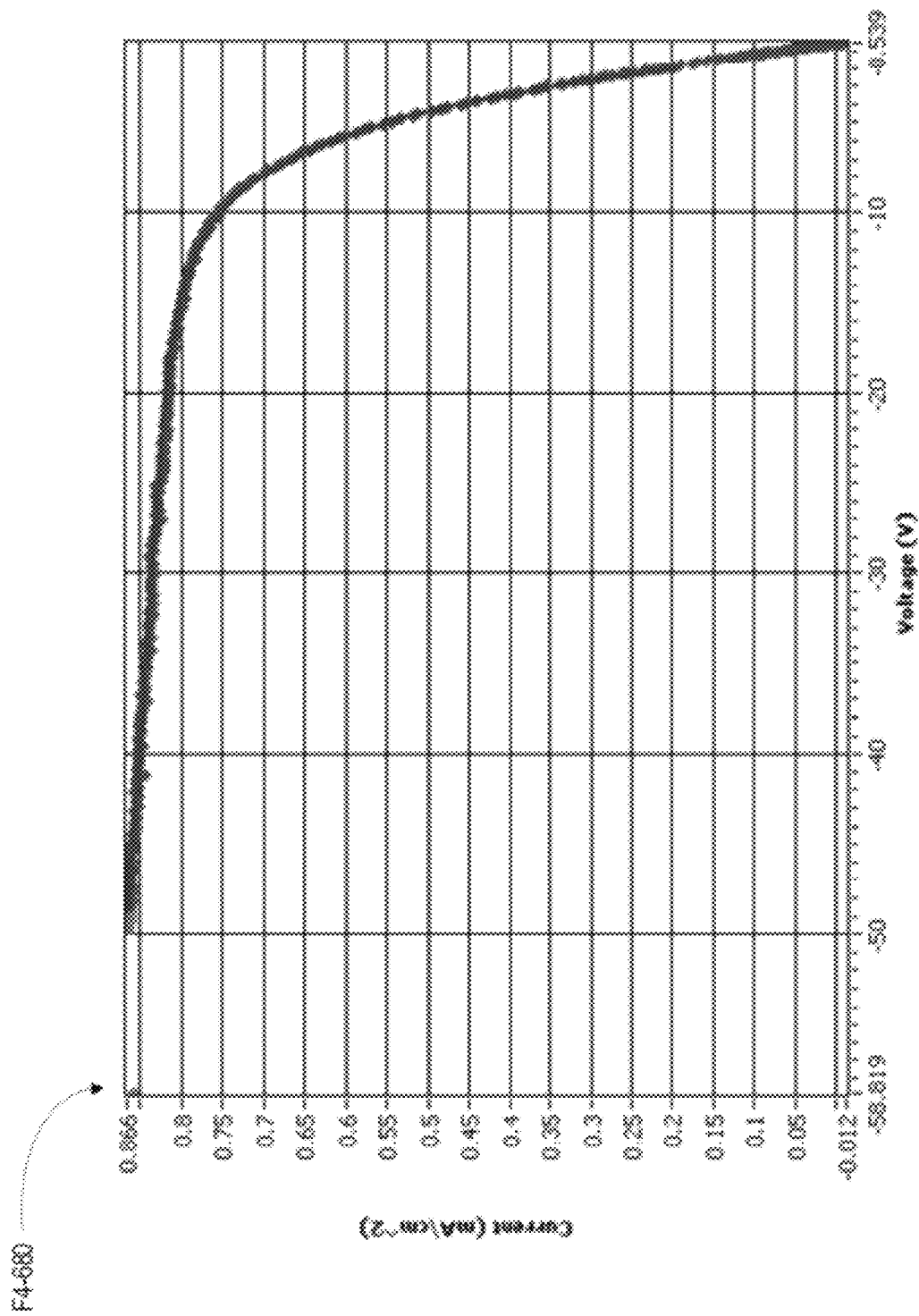

FIG. 14 of the DISCUSSION shows an example of a curve-fitting applied to a current versus voltage graph.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to the use of a capacitively-coupled electrostatic (CCE) probe arrangement or a subset thereof to detect plasma instability events. By way of background, CCE probes have long been employed to measure plasma processing parameters such as ion flux, electron temperature, floating potential, thin film, thickness, etc. CCE probes are known in the art, and details may be obtained from publicly available literature, including for example U.S. Pat. No. 5,936,413 entitled "Method And Device For Measuring An Ion Flow In A Plasma" (Aug. 10, 1999), which is incorporated herein by reference. CCE probes offer many advantages, including for example improved detection sensitivity, minimal perturbation to tire plasma due to the small size of the sensor, ease of mounting on the chamber wall, insensitivity to polymer deposition, on the sensor head, etc. Furthermore, the plasma-facing surface of the sensor can often be made of the same material as that of the surrounding chamber wall, thereby further minimizing perturbation to the plasma. These advantages make CCE probes highly desirable for use in sensing process parameters.

Generally speaking, a CCE probe arrangement involves a plasma-facing sensor connected to one plate of a measuring capacitor. The other plate of the measuring capacitor is coupled to an RF voltage source. The RF voltage source periodically supplies RF oscillation trains, and measurements are performed across the measuring capacitor to determine the rate of capacitor current discharge immediately following the end of each RF oscillation train. Details pertaining to the CCE probe arrangement and CCE probe operation are discussed in the aforementioned U.S. Pat. No. 5,936,413 and will not be further discussed herein.

However, CCE probes have, up to now, been employed to measure parameters such as ion flux, electron temperature, floating potential measurements, etc. Furthermore, CCE probes traditionally perform measurements by charging up the measuring capacitor with the RF voltage source and measuring the capacitor decay current in between RF oscillation trains. There has not been an attempt, up to now, of adapting the CCE probe arrangement or a subset thereof to measure plasma instability events.

In accordance with one or more embodiments of the present invention, an innovative passive CCE probe arrangement is proposed to enable the detection of plasma instability event. Although the CCE probe arrangement in accordance with embodiments of the invention is passive, examples and discussions will be provided herein to enable plasma instability event detection even if the CCE arrangement is actively excited by an external RF voltage source (as was done in the prior art to measure the decay current across the measuring capacitor in between oscillation trains). Thus, in one or more embodiments, the measurement is performed passively in that the measuring capacitor is not required to be charged up using an external RF voltage source as was done in traditional CCE probe arrangements.

It is realized by the inventors herein that when the probe surface is at floating potential, the net current between the probe and the plasma is zero. In other words, although there may be fluxes of electrons and positive ions to the probe from the plasma, the net charge exchanged between the probe head and the plasma is zero, resulting in a zero net current. However, if the potential difference between the probe head and the plasma changes, the current equilibrium is momentarily disturbed, resulting in a momentary non-zero induced current that flows through the measuring capacitor. The potential difference between the probe head and the plasma may change if, for example, the potential of the plasma is changed. A plasma instability event is such an event that has the capability of changing the plasma potential. By detecting this momentary non-zero induced current through the measuring capacitor, plasma instability events may be detected.

The inventors herein also realized that it is possible to eliminate the need for the RF excitation source of the traditional CCE probe architecture in the detection of plasma instability events. Instead, monitoring may be performed passively by monitoring the induced current through the measuring capacitor, which induced current is created by the plasma instability event. In this manner, the architecture of the passive CCE probe may differ and may be much simpler than the prior art CCE probe architecture.

Furthermore, the detection algorithm and strategies may also be different in terms of pattern detection and timing. In general terms, a library of plasma instability "signature" signals is first acquired. For example, a process engineer may force a specific instability event to occur while processing a test substrate. The current that flows through the monitoring capacitor is monitored. Any oscillation or perturbation in the current signal is monitored and recorded. The recorded signal may be thought of as a signature for the specific instability event that occurred. Different types of plasma instability may be generated in order to create the library of plasma instability "signature" signals. During subsequent production processing on a production substrate, the current across the measuring capacitor is monitored. If the current monitored matches a stored plasma instability signature signal, the instability associated with that stored signal may be ascertained.

By ascertaining the plasma instability, process engineers can make adjustment to chamber parameters in order to bring the chamber parameters into compliance. Some plasma instabilities, as mentioned, precede a more serious and damaging event, such as plasma unconfinement. By detecting plasma instability early, process engineers can become more effective and proactive in dealing with chamber faults, thereby minimizing or at least reducing the possibility of serious system damage.

Figure 1:
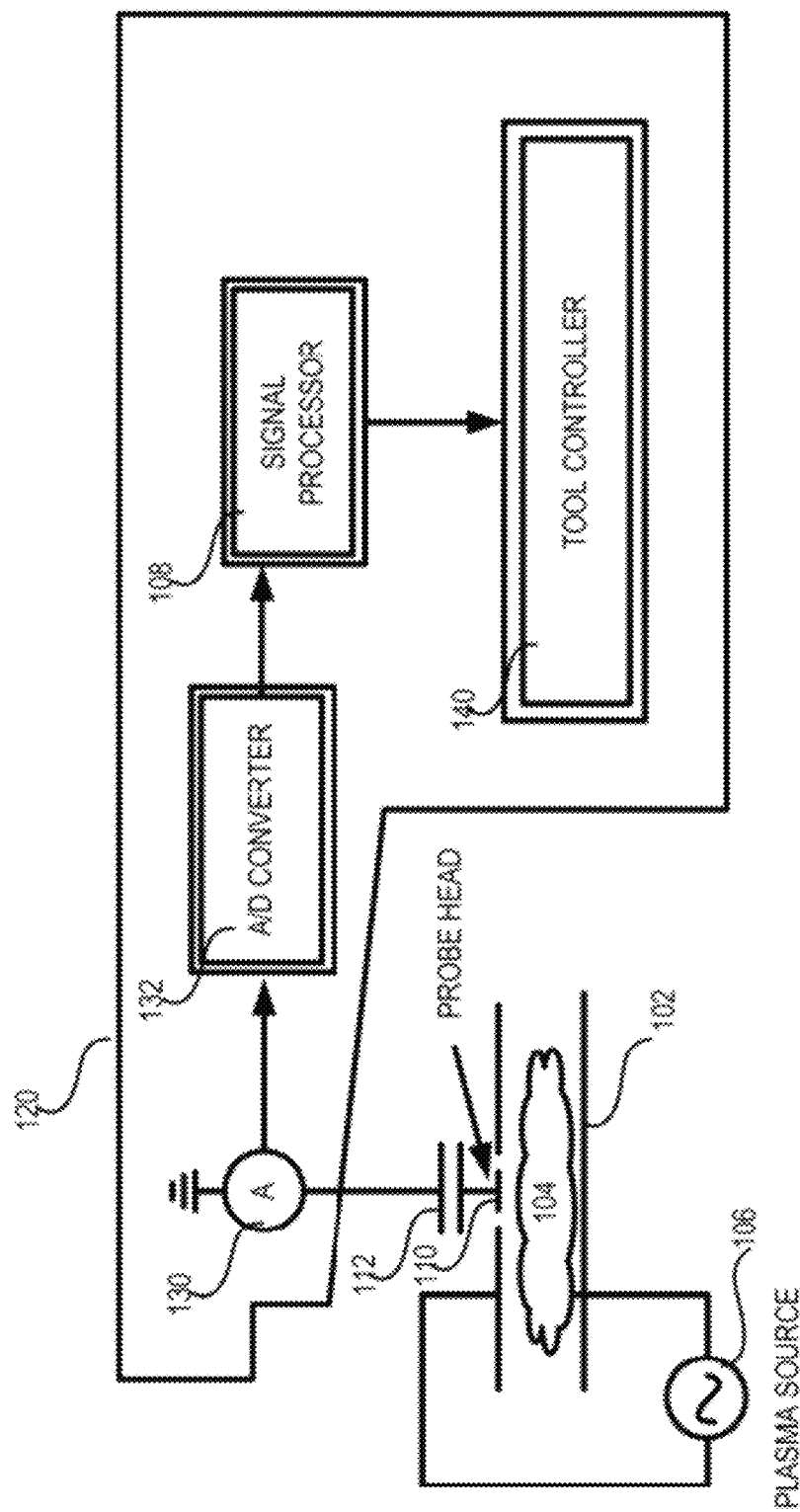
FIG. 1 shows, in accordance with an embodiment of the present invention, a plasma instability event detection arrangement employing a passive CCE probe architecture.

The features and advantages of embodiments of the present invention may be better understood with reference to the figures and discussions that follow. FIG. 1 shows, in accordance with an embodiment of the present invention, a plasma instability event detection arrangement employing a passive CCE probe architecture. Chamber 102 is conventional and is employed to generate a plasma 104 therein for substrate processing purposes. In the example of FIG. 1, plasma 104 is generated and sustained by an RF source 106 (which is not employed to excite the CCE probe arrangement in the example of FIG. 1). A probe head 110 is disposed in the upper electrode although probe head 110 may also be disposed elsewhere on the chamber wall. Probe head 110 may represent a conventional CCE probe head, for example. Probe head 110 is connected in series with one plate of a measuring capacitor 112. The other plate of measuring capacitor 112 is coupled to a detection arrangement 120.

As mentioned, a probe head made of a conductive material is installed in a surface of the chamber. A short RF train is applied to the probe, causing the capacitor (Cm) to charge up and the surface of the probe to acquire a negative potential (several tens of volts negative with respect to ground). Following the end of the RF pulse, the potential of the probe decays back to the floating potential as Cm discharges. The rate at which the potential changes is determined by the plasma characteristics. During this discharge, the potential of the probe Vf is measured with a voltage measurement device, and the current following to the probe and through capacitor Cm is measured with a current measurement device. The curves V(t) and I(t) are used to construct a current-voltage characteristic, VI, which is then analyzed by a signal processor. A model function is fitted to these data points, producing estimates of the floating potential Vf, ion saturation current Isat and electron temperature Te. Further details may be found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477, 007), which is included in the DISCUSSION herein.

In another embodiment, the monitoring by the CCE probe may be performed passively without requiring external RF excitation of the measurement capacitor via an external RF source.

In the example of FIG. 1, detection arrangement 120 is configured to convert the induced current flowing through measuring capacitor 112 into a digital signal for analysis. Thus, there is a current-to-voltage converter 130, which is configured for converting the induced current flowing through measuring capacitor 112 into an analog voltage. An analog-to-digital converter 132 converts the analog voltage signal from current-to-voltage converter 130 into a digital signal, which is then provided to a signal processor 108. Signal processor 108 may represent the hardware and/or software employed to perform signal processing on the digital signal to detect the high frequency perturbations characteristics of plasma instability events.

The exact perturbations may vary from chamber to chamber and may vary depending on plasma instability event types. Irrespective, these perturbations tend to result in a unique signal signature in the sensor signal. The perturbations may be periodic or may be chaotic. By comparing the sensor signal to a library of plasma instability signature signals, plasma instability events may be detected. The detection of the plasma instability events may then be furnished to a tool control circuit 140 to facilitate corrective actions, including for example changing process parameters and/or shutting down the plasma processing system to prevent further damage.

Alternatively or additionally, as shown in FIG. 2, a voltage measurement device 202 may be coupled to the plate 204 of the measuring capacitor that is also coupled to the probe head 206. The voltage measurement device 202 is employed to detect perturbations in the potential of the probe head. Again, the voltage measurement may be analyzed for high frequency perturbation patterns representative of plasma instability events. If desired, the voltage measurements may be converted to a digital signal for signal processing purposes in order to detect, using digital analysis techniques, the high frequency perturbations in the probe voltage.

Alternatively or additionally, a transformer may be coupled to the plate of the capacitor that is not coupled to the probe head to facilitate the detection of the perturbation in the current that flows through the measuring capacitor. One skilled in the art will readily appreciate that other techniques for detecting high frequency transients in the current signal or voltage signal also exist and may well be employed to facilitate the detection of plasma instability events.

Note that since the plasma instability event detection depends on the detection of specific patterns in the sensor signal, it is possible to implement a dual-function CCE probe whereby the measuring capacitor is also charged by the periodic RF pulse trains as is done in conventional CCE probe arrangements. For example, it is possible to perform this detection (on either the induced current or the potential of the probe head) during the time when the RF excitation pulses are not applied to the measurement capacitor. For example, it is possible to perform this detection either in the time period between adjacent excitation RF oscillation trains when the probe head is at a relatively steady floating potential or when the capacitor is discharging because the instability signals tend to be of a higher frequency than the relatively slow discharge rate of the measuring capacitor. As can be appreciated by one skilled in the art from the foregoing discussion, the detection in the induced current signal or the voltage signal of specific patterns may be performed with or without the external RF excitation of the measuring capacitor.

FIGS. 3A and 3B show, in accordance with an embodiment of the invention, a plot of the oscillation patterns indicative of some plasma instability events. Trace 302 tracks the induced current through the measuring capacitor during plasma processing. FIG. 3B shows an amplified view of a portion 304 of trace 302. In FIG. 3B, it is seen that the sensor current signal is periodic at about 4 KHz and has a double-peak shape. A comparison with a library of plasma instability signals reveal that the sensor current signal exhibits characteristics associated with plasma instability, and furthermore, the instability is associated with a high chamber pressure. Indeed, the chamber pressure is about 750 mTorr during the experiment. In this manner, plasma instability may be detected and classified, enabling the process engineer and/or the tool control computer to respond more rapidly and efficiently.

FIGS. 4A and 4B show, in accordance with an embodiment of the invention, a plot of the oscillation patterns indicative of plasma instability before and leading up to a plasma unconfinement event. Trace 402 tracks the ion saturation current during plasma processing. FIG. 4B shows an amplified view of a portion 404 of trace 402. In FIG. 4A, it is seen that the sensor current signal oscillates at about 260 Hz roughly 1.5 seconds before the unconfinement event. The unconfinement event itself starts at point 410 in FIG. 4A (reference number 412 in FIG. 4B).

As can be seen in FIG. 4A, the sensor current signal prior to the unconfinement event (prior to point 410 in FIG. 4) has a characteristic oscillation at a specific frequency range. By comparing the sensor current signal with a library of plasma instability signature signals, this pattern can be correlated with a stored plasma instability signature signal representative of plasma instability prior to a plasma unconfinement event. By ascertaining that the plasma is experiencing the type of instability that typically leads up to an unconfined plasma event, the tool control computer or a human operator may be able to take corrective action (such as changing processing parameters or simply shutting down the tool) to avoid suffering the damage that a plasma unconfinement event would cause to the substrate and/or the chamber components.

In contrast to prior art plasma instability detection techniques, such as measuring the voltage and/or forward RF power and/or reflected RF power on the ESC chuck, the inventive passive CCE probe-based plasma instability detection technique is highly sensitive. Additionally, there is minimal perturbation to the plasma since the CCE probe head tends to be small, to be installed flushed with the surrounding plasma-facing structures of the plasma processing chamber, and may have a plasma-facing probe surface formed of the same material as that of the plasma-facing components of the chamber. Furthermore, the inventive passive CCE probe-based plasma instability detection technique is insensitive to polymer deposition on the plasma-facing probe head since the current is capacitively coupled through any deposition that may be formed on the plasma.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

The DISCUSSION is also found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007) and are incorporated by reference herein.

Discussion of Methods for Automatically Characterizing a Plasma

Advances in plasma processing have provided for growth in the semiconductor industry. To supply chips for a typical electronic product, hundreds or thousands of substrates (such as semiconductor wafers) may be processed. In order for the manufacturing company to be competitive, the manufacturing company needs to be able to process the substrates into quality semiconductor devices with minimal processing time.

Typically, during plasma processing, problems may arise that may cause the substrates to be negatively impacted. One important factor that may alter the quality of the substrate being processed is the plasma itself. In order to have sufficient data to analyze the plasma, sensors may be employed to collect processing data about each substrate. The data collected may be analyzed in order to determine the cause of the problems.

To facilitate discussion, FIG. 5 shows a simple schematic diagram of a data collecting probe in a portion of a plasma system A-100. Plasma system A-100 may include a radio frequency (RF) source A-102, such as a pulsating RF frequency generator, capacitively-coupled to a reactor chamber A-104 to produce plasma A-106. When RF source A-102 is turn on, a bias voltage is developed across an external capacitor A-108, which may be about 26.2 nanofarads (nF). In an example, RF source A-102 may provide a small burst of power (e.g., 11.5 megahertz) every few milliseconds (e.g., about five milliseconds) causing external capacitor A-108 to be charged. When RF source A-102 is turned off, a bias voltage remains on external capacitor A-108 with a polarity such that probe A-110 is biased to collect ions. As the bias voltage decays, the curves as shown in FIGS. 6, 7, and 8 may be traced.

Those skilled in the art are aware that probe A-110 is usually an electrical probe with a conducting planar surface that may be positioned against the wall of reactor chamber A-104. Probe A-110 is thus directly exposed to reactor chamber A-104 environment. Current and voltage data collected by probe A-110 may be analyzed. Since certain recipe may cause a non-conducting deposition layer A-116 to be deposited on probe A-110, not all probes may be able to collect reliable measurements. However, those skilled in the art are aware that a PIF (planar ion flux) probe enables data to be collected despite the non-conducting deposition layer since the PIF probe scheme is not required to draw a direct current (DC) to implement a measurement.

The current and voltage signal in plasma system A-100 is measured by other sensors. In example, when RF source A-102 is switched off, current sensor A-112 and a high impedance voltage sensor A-114, are employed to measure the current and the voltage, respectively. The measurement data collected from current sensor A-112 and voltage sensor A-114 may then be plotted to create a current graph and a voltage graph. The data may be manually plotted or the data may be entered into a software program to create the graphs.

FIG. 6 shows a graph of voltage versus time after a RF charge cycle. At data point B1-202, RF source A-102 has been switched off after an RF charge has been provided (i.e., RF burst). In this example, at data point B1-202, the voltage across probe A-110 is about negative 57 volts. As plasma system A-100 returns to a rest state (interval between data points B1-204 and B1-206), the voltage usually reaches a floating voltage potential. In this example, the floating voltage potential rises from about negative 57 volts to about zero volt. However, the floating voltage potential does not have to be zero and may be a negative or a positive bias voltage potential.

Similarly, FIG. 7 shows a graph of current data collected after a RF charge. At data point B2-252, RF source A-102 has been switched off after an RF charge has been provided. During a decay period B2-254, the return current at external capacitor A-108 may be discharged. In an example, at full charge (data point B2-252), the current is about 0.86 mA/cm$^2$. However, when the current is fully discharged (data point B2-256), the current has returned to zero. Based on the graph, the discharge takes about 75 milliseconds. From data point B2-256 to data point B2-258, the capacitor remains discharged.

Since both the current data and the voltage data are collected over a period of time, a current versus voltage graph may be generated by coordinating the time in order to eliminate the time variable. In other words, the current data collected may be matched against the voltage data collected. Fig. C shows a simple current versus voltage graph for a single time interval between a RF burst. At data point C-302, RF source A-102 has been switched off after an RF charge has been provided.

By applying a non-linear fit to the data collected during each RF burst, plasma A-106 may be characterized. In other words, parameters (e.g. Ion saturation, ion saturation slope, electron temperature, floating voltage potential, and the like) that may characterize plasma A-106 may be determined. Although plasma A-106 may be characterized with the data collected, the process of calculating the parameters is a tedious manual process that requires human intervention. In an example, when the data has been collected after each RF burst (i.e., when the RF charge has been provided and then turned off), the data may be fed into a software analysis program. The software analysis program may perform a non-linear fit to determine the parameters that may characterize the plasma. By characterizing the plasma, the engineer may be able to determine how a recipe may be adjusted in order to minimize substandard processing of the substrates.

Unfortunately, the prior art method of analyzing the data for each RF burst may require several seconds or as much as several minutes to complete. Since there are typically thousands, if not millions of RF bursts to analyze, the total time for characterizing the plasma for a recipe may take hours to calculate. As a result, the prior art method is not an effective method in providing timely relevant data for process control purposes.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, the PIF probe method may be employed to collect data about the plasma that may be positioned within the reactor chamber environment. Data collected from a sensor (e.g., PIF probe) may be employed to characterize the plasma in the reactor chamber. Additionally, since the sensor employs a collection surface as shown in Fig. A, data about the chamber surface may also be determined. In the prior art, the data collected by the PSD probe provides a ready source of data that is available for analysis. Unfortunately, the sheer volume of data that may be collected has made analyzing the data in a timely manner a challenge. Since thousands or even millions of data points may be collected, the task of identifying the relevant interval in order to accurately characterize a plasma may be a daunting task, especially since the data is usually being analyzed manually. As a result, the data collected has not been useful in providing the plasma processing system with a timely characterization of the plasma.

However, if relevant data points that are needed in order to characterize a plasma are identified from the thousands/millions of data points that may be collected, then the time required to characterize a plasma may be significantly reduced. In accordance with embodiments of the invention, a method is provided for automatically characterizing plasma in a relatively short time period. Embodiments of the invention described herein provide for an algorithm for identifying the relevancy range in order to reduce the data points that may need to be analyzed in order to characterize a plasma. As discussed herein, the relevancy range refers to a smaller set of data points from the thousands or millions of data points that may be gathered between each RF burst. Embodiments of the invention further provide for estimating seed values that may be applied to a mathematical model that calculates the values for characterizing a plasma. By performing curve-fitting to the relevancy range, parameters that may be employed to characterize a plasma may be calculated.

The features and advantages of the present invention may be better understood with reference to the figures and discussions that follow.

FIG. 9 shows, in an embodiment of the invention, a simple flow chart illustrating the steps for automatically characterizing plasma during substrate processing. Consider the situation wherein, an RF charge has been provided during substrate processing.

At a first step D-402, current and voltage data are collected. In an example, after the RF source has been turned on, an RF charge (pulse) is provided. After the RF charge has been turn off a current sensor and a voltage sensor may be employed to collect data at a probe, such as a planar ion flux probe, which may be mounted to a chamber wall of the reactor chamber. As aforementioned, the number of data points that may be collected by the sensors may range in the thousands or millions. In some cases, thousands to ten of thousands of data points may be collected between each RF burst making near-real-time analysis in the prior art nearly impossible.

In the prior art, several hours may be allotted for analyzing the measurement data that is collected during semiconductor substrate processing. In one aspect of the invention, the inventors herein realized that the measurement data between each RF burst does not have to be analyzed in order to characterize a plasma. Instead, if curve-fitting is applied to a relevancy range of the data set parameters that may be employed to characterize the plasma may be determined.

At a next step D-404, a relevancy range is determined. As aforementioned, the relevancy range refers to a subset of the data set that has been collected between each RF burst. In the prior art, since the data is being manually analyzed, the sheer volume of the data collected make calculating the relevancy range a challenging task. In many instances, the relevancy range may be visually estimated. In identifying the relevancy range, noises that may exist may be substantially eliminated from the subset of data set. In an example, during complex substrate processing, a polymer buildup may occur on the probe, causing a portion of the data collected to be skewed. For example, the portion of the data that may be impacted tends to be the data that may be collected once the capacitor has been fully discharged. In identifying the relevancy range, data associated with the polymer buildup may be removed from the analysis. In other words, the determination of the relevancy range may enable plasma characterisation to occur without being subject to random noises. Discussion about how a relevancy range may be determined, for an example, is provided later in the discussion of FIG. 10.

In addition to identifying the relevancy range, the seed values may also be determined, at a next step D-406. As discussed herein, the seed values refer to the estimated value of the slope, the electron temperature, the ion saturation value, the floating voltage potential, and the like. Discussion about how the seed values may be estimated, for example, is provided in the discussion of FIG. 10.

The relevance range and the seed values are utilized to perform curve-fitting. Since curve-fitting has to be performed before the next RF burst, the methods employed to determine the relevancy range and/or seed values have to utilize minimum overhead and produce values that are close to the final fit values, thereby reducing number of curve-fitting iterations that may be required in order to achieve a rapid convergence.

With the relevancy range and the seed values, at a next step D-408, a non-linear fit (e.g., curve-fitting) may be performed, thereby enabling the plasma to be characterized within a shorter time period without requiring an expensive high-end computer. Unlike the prior art, the method allows for results from a decay interval due to a single RF burst to be characterised in approximately 20 milliseconds instead of requiring a few minutes or even a few hours to process. With near-realtime analysis capability, the method may be applied as part of an automatic control system to provide the engineer with relevant data during plasma processing.

FIG. 10 shows, in an embodiment of the invention, a simple algorithm for determining the relevancy range and the seed values. FIG. 10 will be discussed in relation to FIGS. 11, 12, 13, and 14.

At a first step E-502, the data collected during each RF burst is automatically plotted. In an example, the current data that may be collected by the current sensor is plotted into a current versus time graph F1-600, such as the one shown in FIG. 11. In another example, the voltage data collected may be plotted into a voltage versus time graph F2-650, as shown in FIG. 12. Although the data may produce similar graphs as the prior art, unlike the prior art, the data collected is automatically fed into the analysis program without requiring human intervention. Alternatively, the measurement data collected does not have to be plotted. Instead, the data may be fed directly into the analysis program. Instead, the graphs are provided as visual examples to explain the algorithm.

Unlike the prior art, the entire data set is not analyzed in order to characterize a plasma. Instead, a relevancy range is determined. To determine the relevancy range, a percentage decay point may first be determined, at a next step E-504. As discussed herein, the percentage decay point refers to the data point at which the original value has decayed to a certain percentage of the original value. In an embodiment, the percentage decay point may represent the end of the data interval to be analyzed. In an example, when the RF source is switched off, the current value is about 0.86 mA/cm². The value is represented by a data point F1-602 on graph F1-600 of FIG. 11, if the percentage decay point is set to ten percent of the original value, the percent decay point is at data point F1-604, which is about 0.086 mA/cm². In other words, the percentage decay point may be determined by applying a pre-defined percentage to the original value, which is value of the electrical charge when the RF source is switched off and the system is returning to an equilibrium state. In an embodiment, the percentage is empirically determined. In an embodiment, instead of employing a percentage decay point to determine the end of the data interval, the peak of a first derivative of the data collected for each RF burst may be calculated.

At a next step E-506, the algorithm may determine the ion saturation interval, which is the data subset between the original value and a second decay point. As discussed herein, the ion saturation interval refers to the region of the current-voltage (IV) curve at which the probe potential is sufficiently negative with respect to the floating potential such that the electron flux to the probe is negligible. In this region the current to the probe increases slowly and linearly with increasingly negative potential. In addition, the ion saturation interval is the regime at which the bias voltage is sufficiently negative with respect to the floating potential such that the probe will collect all the available ions in the system. In other words, the collected current "saturates" as the bias voltage is raised sufficiently high. Also, as discussed herein, the "available ions" refers to the flux of ions impinging upon the sheath boundary, which may enlarge as the bias voltage is further increased.

In other words, the ion saturation interval is the interval from data points F1-602 and F1-606 of FIG. 11. In an embodiment, the second decay point may be determined by taking a percentage of the original value (i.e., data point F1-602). In an example, if the second decay point is about 95 percent of the original value, the second decay point is about 0.81 mA/cm² (i.e., data point F1-606). Hence, the ion saturation interval is from the original value (data point F1-602) to the second decay point (data point F1-606). Note that the second decay point is between the original value (data point F1-602) and the percentage decay point (data point F1-604). Similar to the percentage decay point, the second decay point may also be based on a pre-defined threshold, in an embodiment. In an embodiment, the percentage is empirically determined.

Once the ion saturation interval has been determined, at a next step E-508, the slope (s) and the ion saturation ($i_0$) may be estimated. As aforementioned, the slope (s) and the ion saturation ($i_0$) are two of the four seed values that may be applied to a mathematical model (Equation 2 below) to determine the parameters that characterize a plasma. In an example, the slope (s) may be determined by performing linear regression. In another embodiment, the algorithm may also determine the ion saturation ($i_0$) by taking the average of the data values between data points F1-602 and F1-606.

At a next step E-510, the algorithm may determine the inflection point, which is the point at which the first derivative changes sign. In an embodiment, the inflection point may be calculated by identifying the minimal value of the first derivative of the current values between the percentage decay point and the second decay point. To illustrate, FIG. 13 shows the first derivative of the values between a percentage decay point (F3-664) and an original point (F3-662) of a current signal F3-660. The inflection point is the minimal data point of the first derivative (F3-670), which has a value of −0.012 mA/cm² and an index value of 226 (as shown by data point F3-666). To determine the inflection value, the index value is mapped to current signal plot F3-660. In this example, when the index value of die first derivative is mapped to current signal F3-660, the inflection value is 0.4714 mA/cm², as shown by data point F3-668.

In an embodiment, the relevancy range is defined as the range between the original value and the inflection point. Additionally or alternatively, a percent decay threshold may be set (e.g. at 35 percent) instead of calculating the inflection point. In an example, using the percent decay point of 35 percent which may be empirically determined, the relevancy range may fall between points F1-602 and F1-604 of FIG. 11.

$$T_e = \text{abs}\left(\frac{I_{meas}(t)}{\left(\frac{dI_{meas}}{dV_{meas}}\right)}\right) = \text{abs}\left(\frac{I_{meas}(t)}{\left(\frac{dI_{meas}}{dt}\right)\left(\frac{dt}{dV_{meas}(t)}\right)}\right) \qquad \text{[Equation 1]}$$

TABLE 1

Parameters defined

| Parameters | Variable name |
|---|---|
| $I_{meas}$ | Current measured |
| $V_{meas}$ | Voltage measured |
| t | Current time |
| $T_e$ | Electron temperature |

With the inflection point identified, the electron temperature may be estimated, at a next step E-512. The electron temperature may be estimated by employing Equation 1 above. The current and voltage data utilized to calculate the electron temperature is within the transition interval, which is usually when a probe is drawing less current than the ion saturation current. In an embodiment, the time at which the current and voltage data is measured may correspond with the inflection point. Alternatively, the inflection point of the current-voltage (I-V) curve may also be employed. Since the electron temperature is a ratio of a first derivative (as determined in calculating the percentage decay point) of the data collected for an RF burst at a time corresponding to the inflection point on the current-voltage curve, the computational overhead that may be required to generate the number is minimal.

At a next step E-514, the algorithm may determine the floating voltage potential. Since the floating voltage potential is determined based on the voltage data collected, the floating voltage potential may be determined without first having to determine the values as calculated in steps E-504-E-512. Those skilled in the art are aware that floating voltage potential is the electrical potential at which the probe floats after the external capacitor has fully discharged. Typically, the floating-voltage potential may be determined by looking at the signal that occurs right before the nest RF burst. However, due to the possibility of polymer buildup causing distortion, erroneous data (i.e., noise) may be collected; thus, the floating voltage potential may be calculated by averaging the voltage values collected toward the end of the collection period. In an embodiment, the floating voltage potential may be calculated from data point F2-652 (the data point at which the voltage first reaches its floating potential) to data point F2-654 (the data point just right before the next RF burst), as shown in FIG. 12. In another embodiment, the floating voltage potential may be based on the voltage values within a window F2-656, which is located between data points F2-652 and F2-654, as shown in FIG. 12. In an embodiment, window F2-656 may be of any size as long as the window begins before the prior pulse has decayed more than 99 percent and ends when the next pulse begins. In one embodiment, the floating voltage potential, may be determined from a window that provides an average value with a low standard deviation (error).

As can be appreciated from the foregoing, the methods for determining the relevancy range and the seed values account for anomalies that may occur in the current, voltage and/or current-voltage (I-V) curves. In an example, polymer buildup may occur at the end of an RF burst. However, by applying the aforementioned algorithms, the relevancy range and the seed values are impervious to unexpected artifacts that may occur during processing.

Once the relevancy range has been determined and the seed values have been calculated, at a next step E-516, the current values may be plotted against the voltage values and curve-fitting may be applied to generate graph F4-680 of FIG. 14. In an example, a non-linear curve fit, such as Levenberg-Marquardt algorithm, may be applied to perform the curve-fitting. By generating a curve-fitting graph and applying the seed values to the mathematical model, such as Equation 2 below, the four parameters that may be employed to characterize the plasma may be determined.

$$I = I_0 \left\{ 1 - s^*(V - V_f) - \exp\left[\frac{(V - V_f)}{T_e}\right] \right\} \quad \text{[Equation 2]}$$

TABLE 2

Parameters defined

| Parameters | Variable name |
|---|---|
| I | Current |
| $I_0$ | Ion saturation |
| S | Slope |
| V | Voltage |
| $V_f$ | Floating voltage potential |
| $T_e$ | Electron temperature |

As can be appreciated from one or more embodiments of the present invention, an automated method for characterizing plasma during plasma processing is provided. By determining a relevancy range and a set of seed values, plasma characterization may occur without having to process thousands or millions of data points that are usually collected after a single RF burst. The automated method transforms a previously tedious and manual process into an automatic task that may be performed quickly and efficiently. With data analysis significantly shortened from a few minutes (or even a few hours) to a few milliseconds, plasma characterization may be performed during plasma processing instead of being a post-production process. Thus, relevant data may provide insights into the current plasma environment, thereby enabling recipe and/or tool adjustment to occur and waste to be minimized.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

What is claimed is:

1. A method for detecting plasma instability within a processing chamber of a plasma processing system during substrate processing, comprising:
    collecting a set of process data including a set of induced current signals, wherein the set of induced current signals corresponds to current induced to flow through a measuring capacitor by plasma within the processing chamber, and wherein a first plate of the measuring capacitor is connected to a plasma-facing sensor and the induced current signals are measured at a second plate of the measuring capacitor;
    converting said set of induced current signals into a set of analog voltage signals;
    converting said set of analog voltage signals into a set of digital signals; and
    analyzing said set of digital signals to detect high frequency perturbations, said high frequency perturbations indicating said plasma instability.

2. The method of claim 1 further including comparing rate of change of said current signals to a pre-defined threshold, wherein said plasma instability exists if said rate of change is outside of said pre-defined threshold.

3. The method of claim 1 further including collecting voltage measurement data from the plasma-facing sensor to determine potential change during processing.

4. The method of claim 3 further including converting said voltage measurement data into a set of digital signals.

5. The method of claim 4 farther including analyzing said set of digital signals to detect said high frequency perturbations, wherein said high frequency perturbations indicating said plasma instability.

6. The method of claim 5 further including comparing rate of change of said voltage signals to a pre-defined threshold, wherein said plasma instability exists if said rate of change is outside of said pre-defined threshold.

7. The method of claim 1 wherein said set of induced current signals is collected when no RF signal is applied to either said measuring capacitor or to a plasma-facing probe that is in electrical communication with a plate of said measuring capacitor.

8. The method of claim 1 further including applying a set of periodic radio frequency (RF) pulse trains to said measuring capacitor, wherein said set of induced current signals is collected in between two adjacent RF pulse trains.

9. A method for detecting plasma instability within a processing chamber of a plasma processing system during substrate processing, comprising:
   collecting a set of process data, said process data including a set of induced current signals flowing through a measuring capacitor;
   converting said set of induced current signals into a set of analog voltage signals; converting said set of analog voltage signals into a set of digital signals; and
   analyzing said set of digital signals to detect high frequency perturbations, said high frequency perturbations indicating said plasma instability;
   comparing rate of change of said current signals to a pre-defined threshold, wherein said plasma instability exists if said rate of change is outside of said pre-defined threshold; and
   sending a message to a tool controller circuit when said plasma instability is detected, said tool control circuit is configured to apply correction actions to fix said plasma instability.

10. A method for detecting plasma instability within a processing chamber of a plasma processing system during substrate processing, comprising:
    collecting a set of process data, said process data including a set of induced current signals flowing through a measuring capacitor;
    converting said set of induced current signals into a set of analog voltage signals; converting said set of analog voltage signals into a set of digital signals; and
    analyzing said set of digital signals to detect high frequency perturbations, said high frequency perturbations indicating said plasma instability; and
    applying a set of periodic radio frequency (RF) pulse trains to said measuring capacitor and measuring current decay signals of said measuring capacitor.

11. The method of claim 10 further including applying an arc detection algorithm to detect said high frequency perturbations above a pre-determined threshold on said current decay signals.

12. The method of claim 11 further including comparing rate of change of said current decay signals to a pre-defined threshold, wherein said plasma instability exists if said rate of change is outside of said pre-defined threshold.

13. A method for detecting plasma instability within a processing chamber of a plasma processing system during substrate processing, comprising:
    providing a plasma-facing probe;
    providing a measuring capacitor, whereby a first plate of said measuring capacitor is in electrical communication with said plasma-facing probe;
    collecting a set of process data, said process data including a set of current signals induced, by plasma within the processing chamber to flow, through said measuring capacitor, wherein said set of induced current signals is passively generated in that said set of induced current signals is not caused by a previous or contemporaneous application of an RF signal from an external RF source to said measuring capacitor;
    converting said set of induced current signals into a set of analog voltage signals;
    converting said set of analog voltage signals into a set of digital signals; and
    analyzing said set of digital signals to detect high frequency perturbations, said high frequency perturbations indicating said plasma instability.

14. The method of claim 13 further including comparing rate of change of said current signals to a pre-defined threshold, wherein said plasma instability exists if said rate of change is outside of said pre-defined threshold.

15. The method of claim 13 further including collecting voltage measurement data from a plasma-facing sensor to determine potential change during processing.

16. The method of claim 15 further including converting said voltage measurement data into a set of digital signals.

17. The method of claim 16 further including analyzing said set of digital signals to detect said high frequency perturbations, wherein said high frequency perturbations indicating said plasma instability.

18. The method of claim 17 further including comparing rate of change of said voltage signals to a pre-defined threshold, wherein said plasma instability exists if said rate of change is outside of said pre-defined threshold.

19. The method of claim 16 further comprising comparing said set of digital signals with a library of digital signal signatures to ascertain whether a plasma instability event exists.

20. A method for detecting plasma instability within a processing chamber of a plasma processing system during substrate processing, comprising:
    providing a plasma-facing probe;
    providing a measuring capacitor, whereby one plate of said measuring capacitor is in electrical, communication with said plasma-feeing probe;
    collecting a set of process data, said process data including a set of induced current signals flowing through said measuring capacitor, wherein said set of induced current signals is passively generated in that said set of induced current signals is not caused by a previous or contemporaneous application of an RF signal from an external RF source to said measuring capacitor;
    converting said set of induced current signals into a set of analog voltage signals;
    converting said set of analog voltage signals into a set of digital signals;
    analyzing said set of digital signals to detect high frequency perturbations, said high frequency perturbations indicating said plasma instability; and sending a message to a tool controller circuit when said plasma instability is detected, said tool control circuit is configured to apply correction actions to fix said plasma instability.

* * * * *